United States Patent [19]

Wikswo, Jr. et al.

[11] Patent Number: 5,038,104

[45] Date of Patent: Aug. 6, 1991

[54] MAGNETOMETER FLUX PICK-UP COIL WITH NON-UNIFORM INTERTURN SPACING OPTIMIZED FOR SPATIAL RESOLUTION

[75] Inventors: John P. Wikswo, Jr., Brentwood, Tenn.; Bradley J. Roth, Kensington, Md.

[73] Assignee: Vanderbilt University, Nashville, Tenn.

[21] Appl. No.: 475,171

[22] Filed: Feb. 5, 1990

[51] Int. Cl.$^5$ ................. G01R 33/035; G01R 33/10
[52] U.S. Cl. ................................ 324/258; 324/248; 324/261; 336/224; 505/845
[58] Field of Search ............. 324/248, 260, 258, 239, 324/243, 262; 336/224; 505/705, 845

[56] References Cited

U.S. PATENT DOCUMENTS

| | | |
|---|---|---|
| 4,453,067 | 6/1984 | Karklys et al. . |
| 4,490,426 | 5/1986 | Lutes . |
| 4,517,540 | 5/1985 | McDougal . |
| 4,585,999 | 4/1986 | Hilbert et al. . |
| 4,593,245 | 6/1986 | Viertl et al. . |
| 4,613,817 | 9/1986 | Hoenig ............................. 324/248 |

OTHER PUBLICATIONS

John P. Wikswo, Jr., Optimization of Squid Differential Magnetometers, *Future Trends in Superconductive Electronics*, AIP Conference Proceedings, No. 44, pp. 145-149, 12/1978.

John P. Wikswo, Jr., et al., Magnetic Determination of the Spatial Extent of a Single Cortical Current Source: A Theoretical Analysis[1], Electroencencephalography and Clinical Neurophysiology, 12/1988, 69: 266-279, Elsevier Scientific Publishers Ireland, Ltd.

John P. Wikswo, Jr., High-Resolution Measurements of Biomagnetic Fields, *Advances in Cryogenic Engineering*, vol. 33, Plenum Publishing Corporation, 12/1988, pp. 107-116.

Bradley J. Roth et al., Using a Magnetometer to Image A Two-Dimensional Current Distribution, J. Appl. Phys., 65(1), Jan. 1, 1989, pp. 361-372.

S. Evanson et al., A Comparison of the Performance of Planar And Conventional Second-Order Gradiometers Coupled to a Squid for the NDT of Steel Plates, IEEE Transactions on Magnetics, vol. 25, No. 2, Mar. 1989, pp. 1200-1203.

A. C. Bruno et al., Discrete Spatial Filtering with Squid Gradiometers in Biomagnetism, J. Appl. Phys., 59(7), Apr. 1, 1986, pp. 2584-2589.

R. Turner, A Target Field Approach to Optimal Coil Design (Letter to the Editor), J. Phys. D: Appl. Phys., 19; May 1986, pp. L147-L151.

Robert Turner, Minimum Inductance Coils, J. Phys. Ed. Sci., 21 (5/1988), pp. 948-952.

*Primary Examiner*—Kenneth Wieder
*Assistant Examiner*—W. S. Edmonds
*Attorney, Agent, or Firm*—Richard V. Westerhoff

[57] ABSTRACT

Pickup coils for imaging magnetometers are formed from plural turns of a conductor with varying spacing between turns selected so that the Fourier transform of the coil turns function which is the filter function of the coil, has no zeroes within the spatial frequency bandwidth of the magnetic field generated by a two or three dimensional current to be imaged. Various exemplary coil configurations are presented including a Gaussian distribution for the turns of a planar coil.

26 Claims, 16 Drawing Sheets

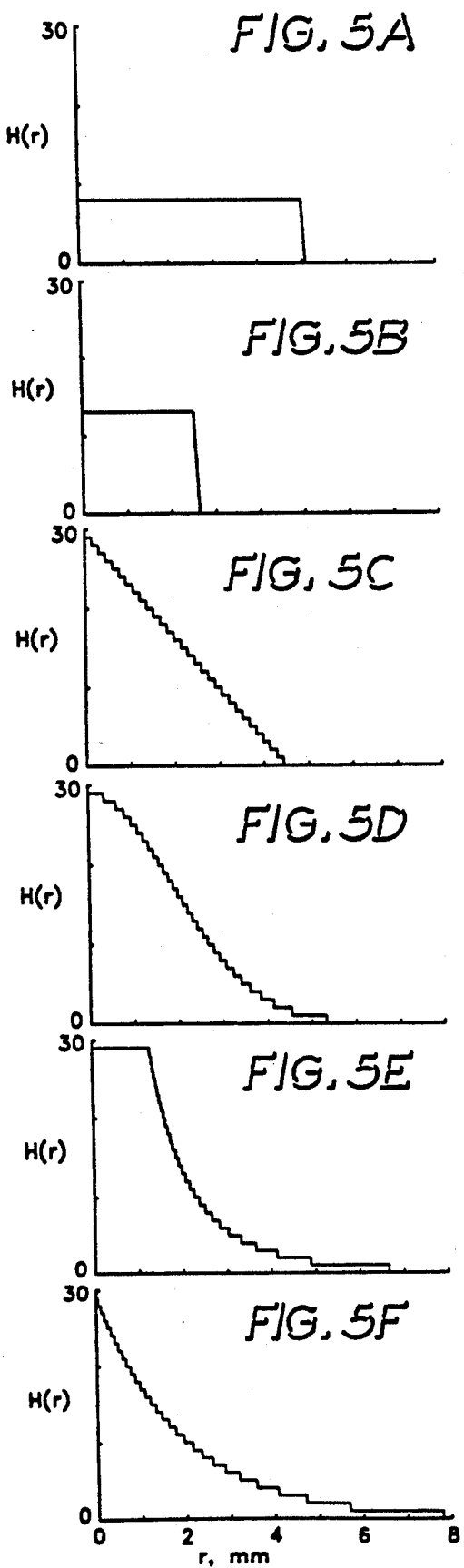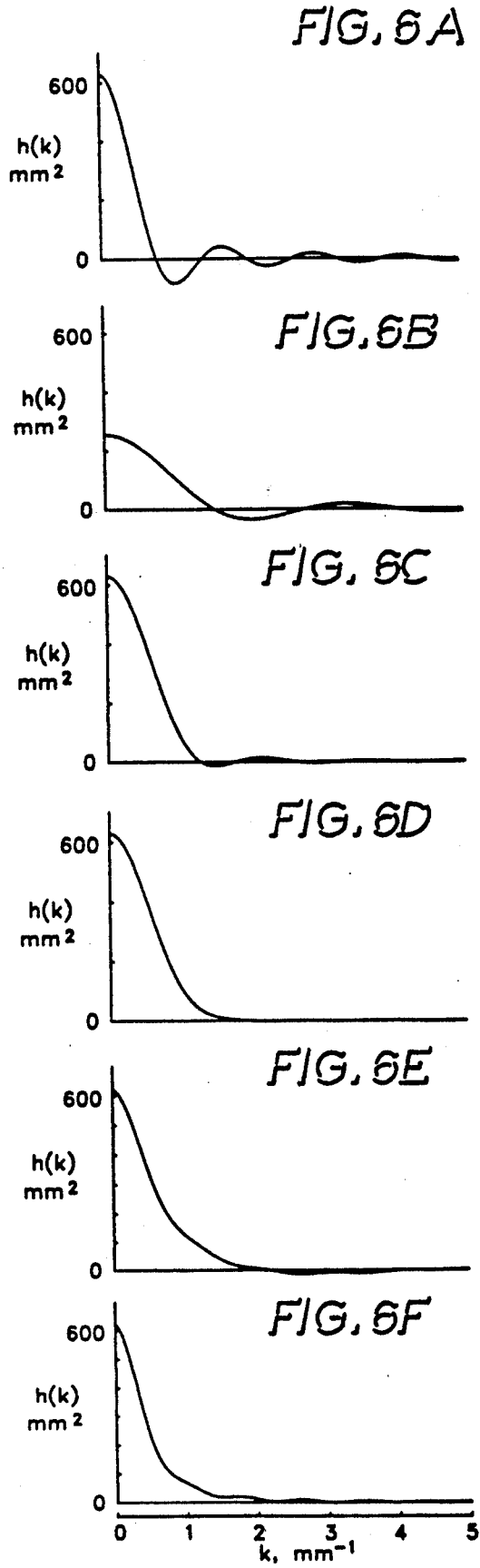

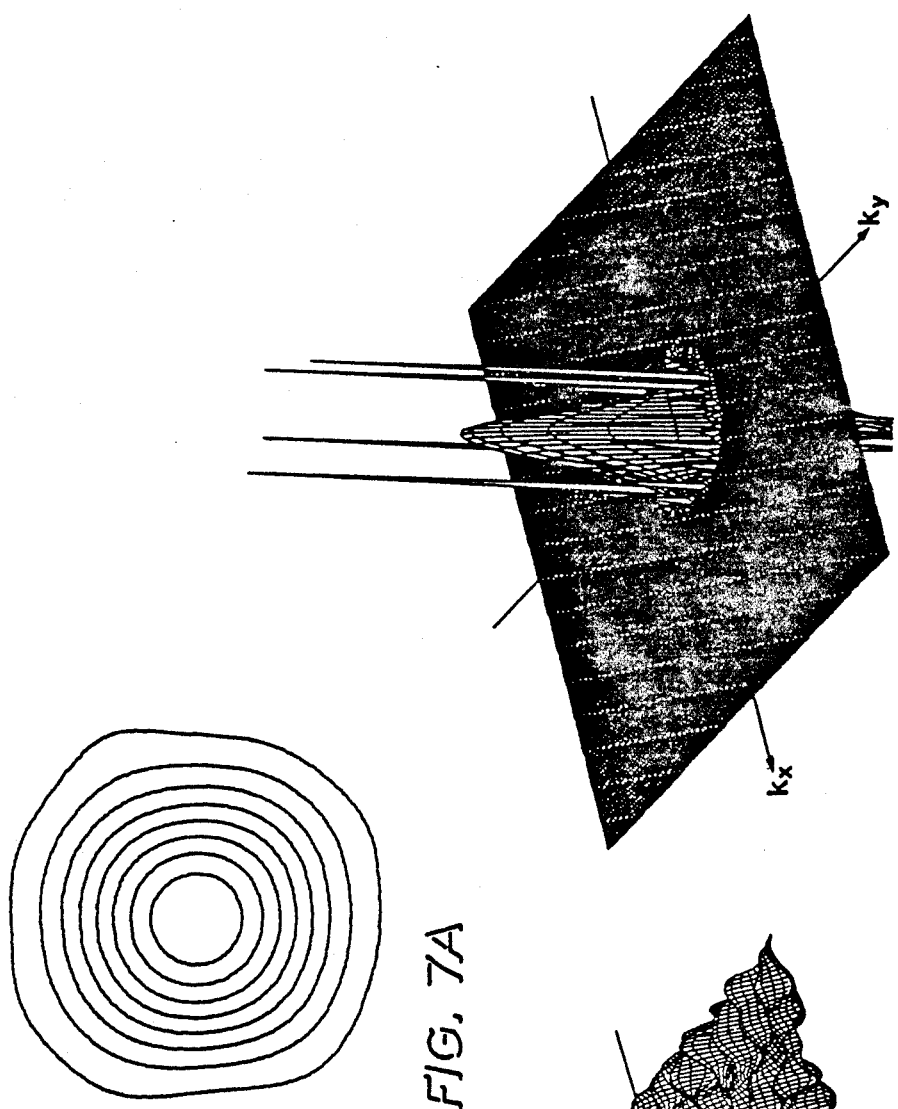
FIG. 9A
FIG. 7A
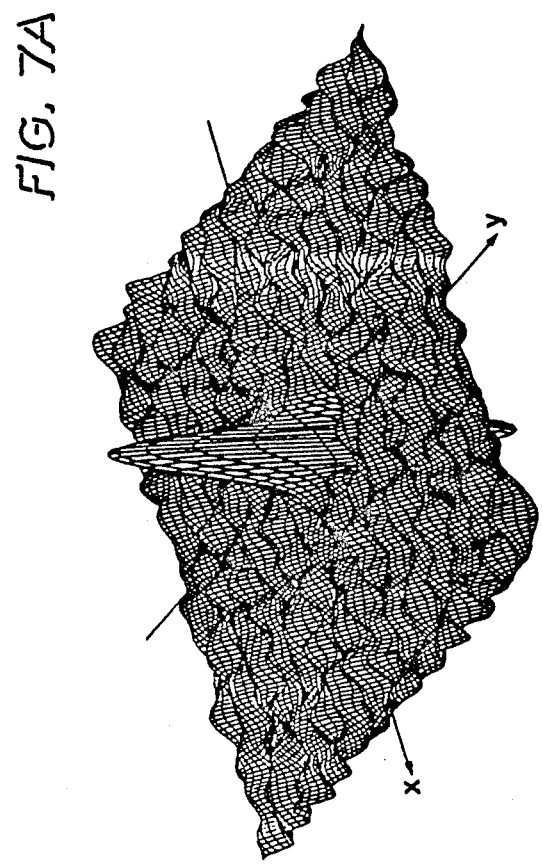
FIG. 8A

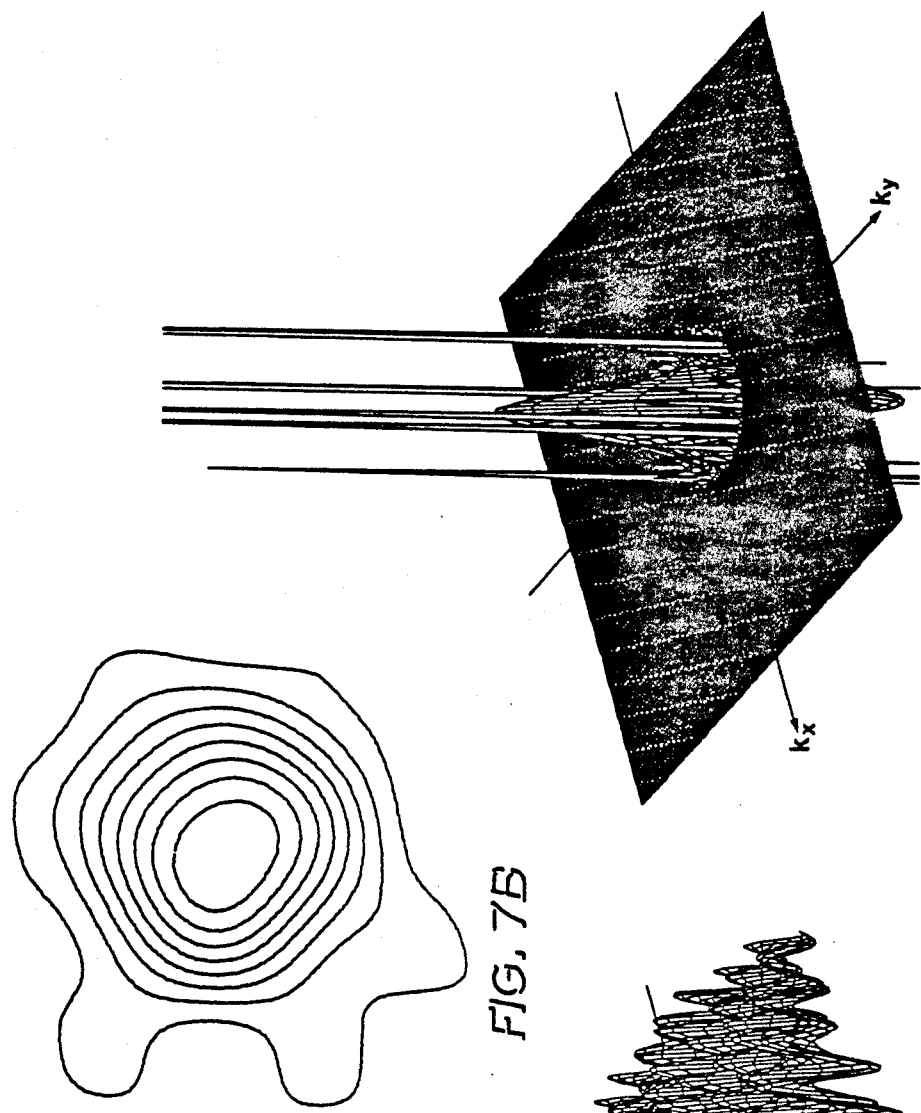
FIG. 7B
FIG. 9B
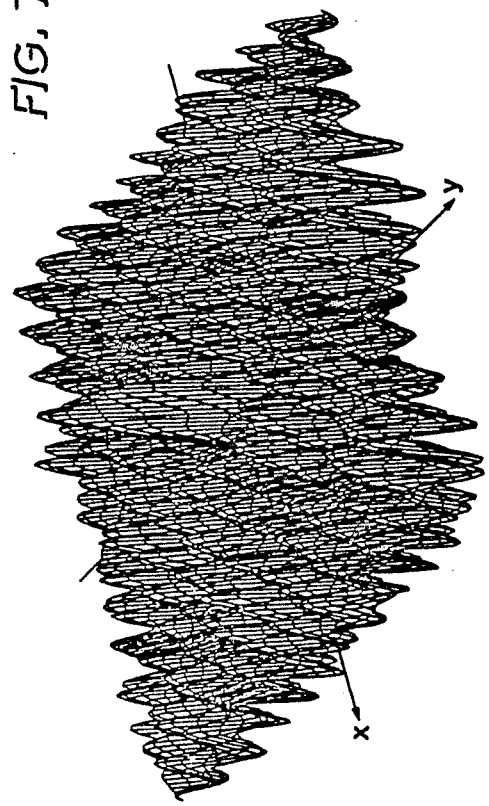
FIG. 8B

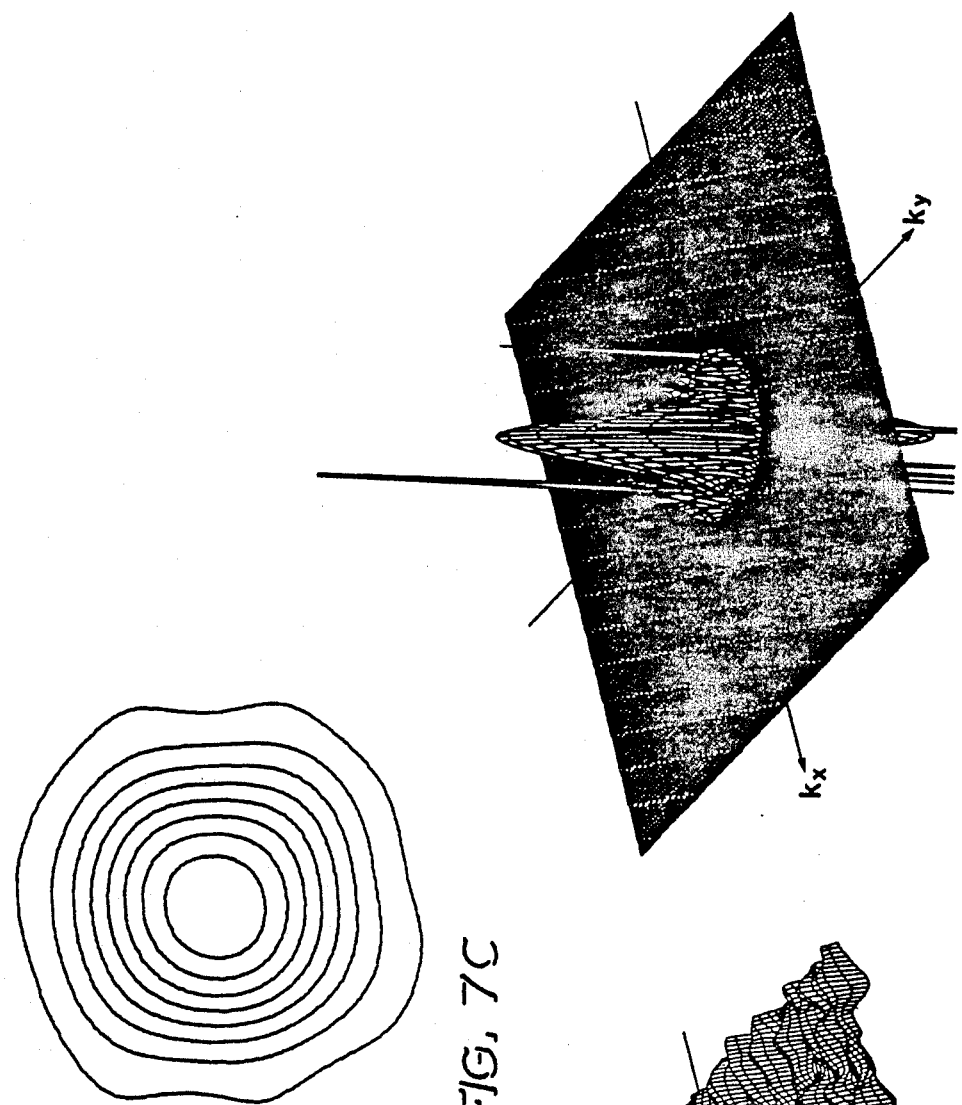
FIG. 7C
FIG. 9C
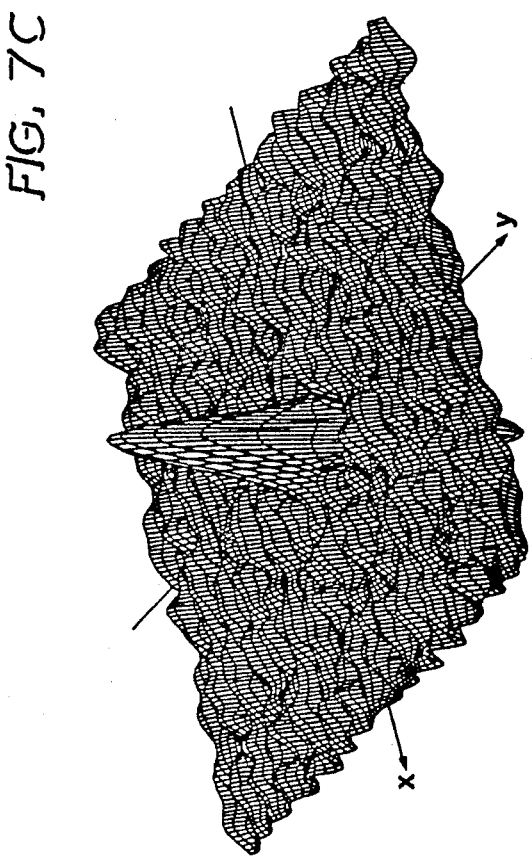
FIG. 8C

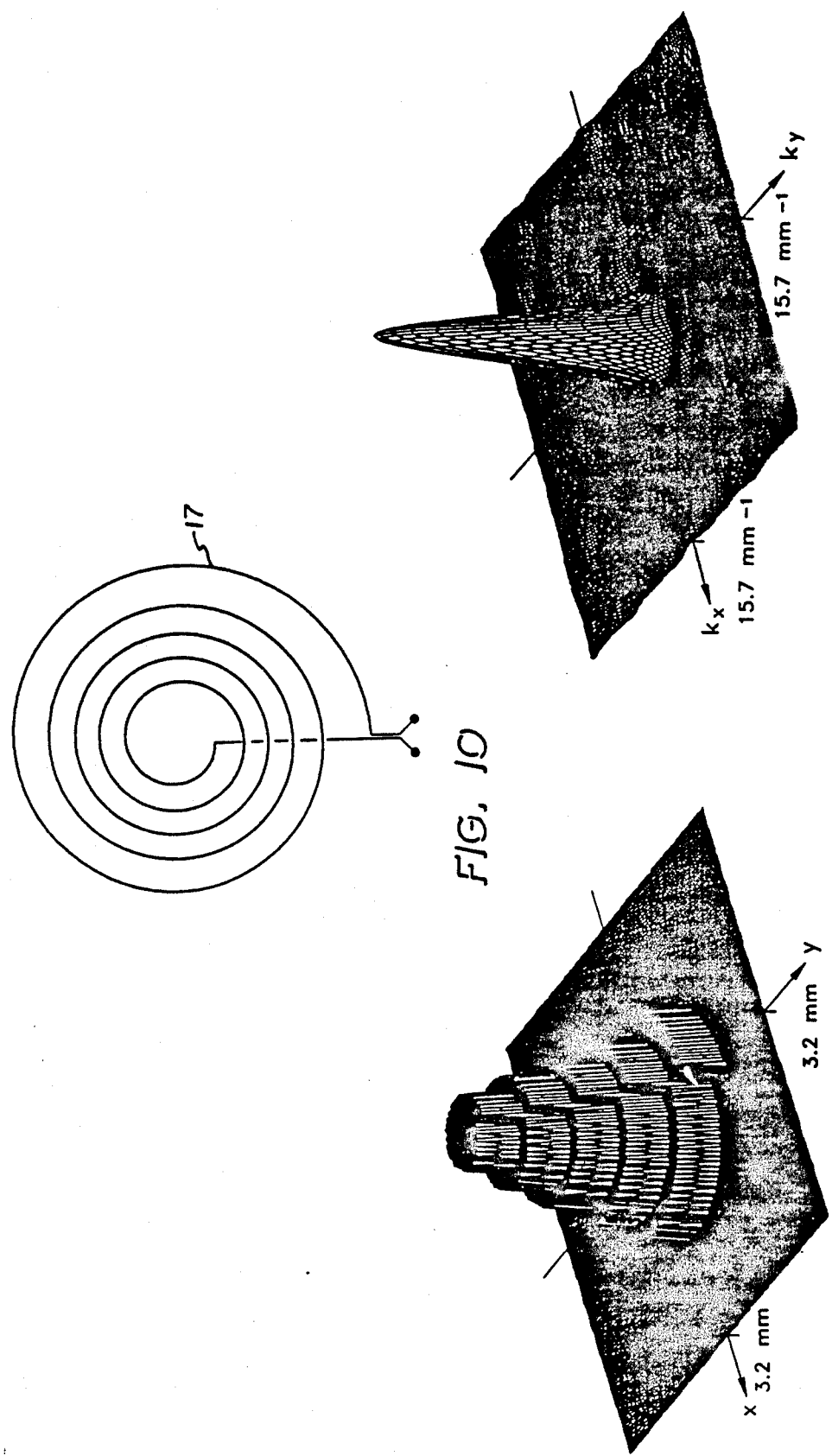

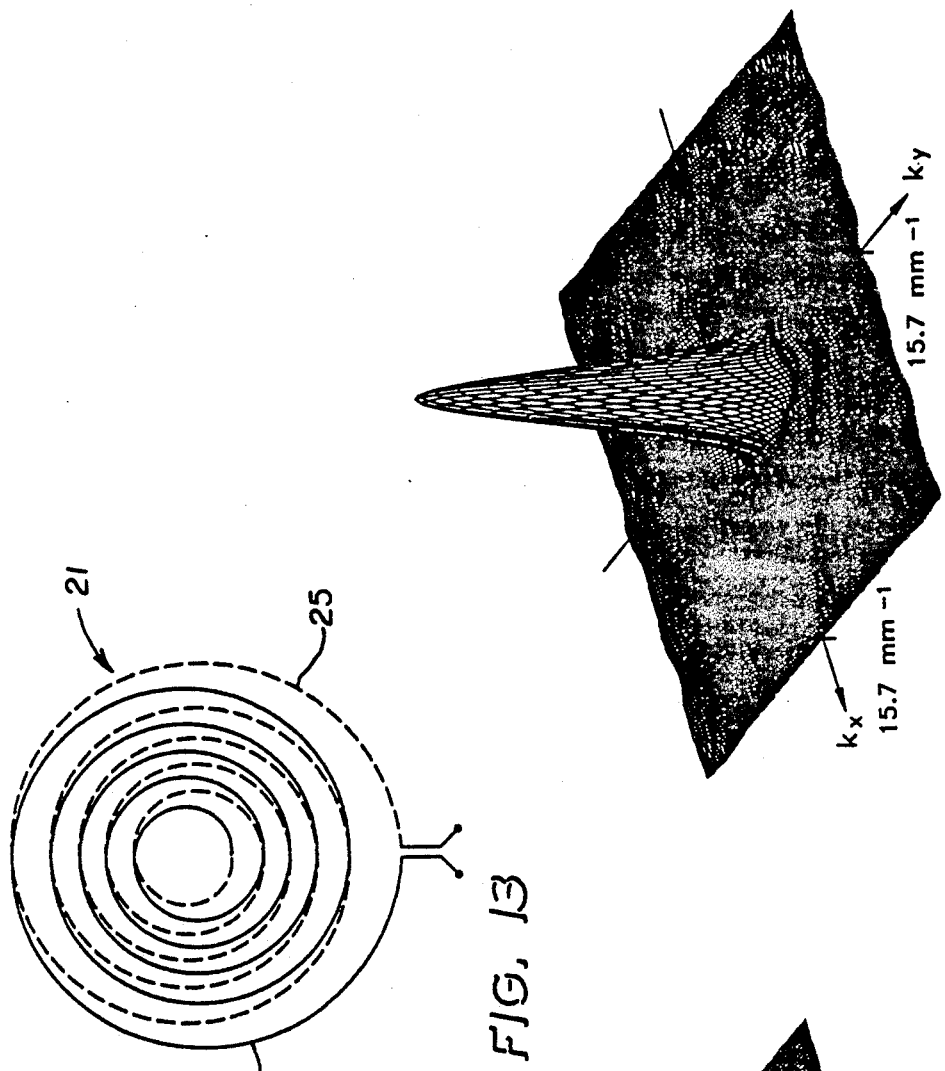
FIG. 13
FIG. 15
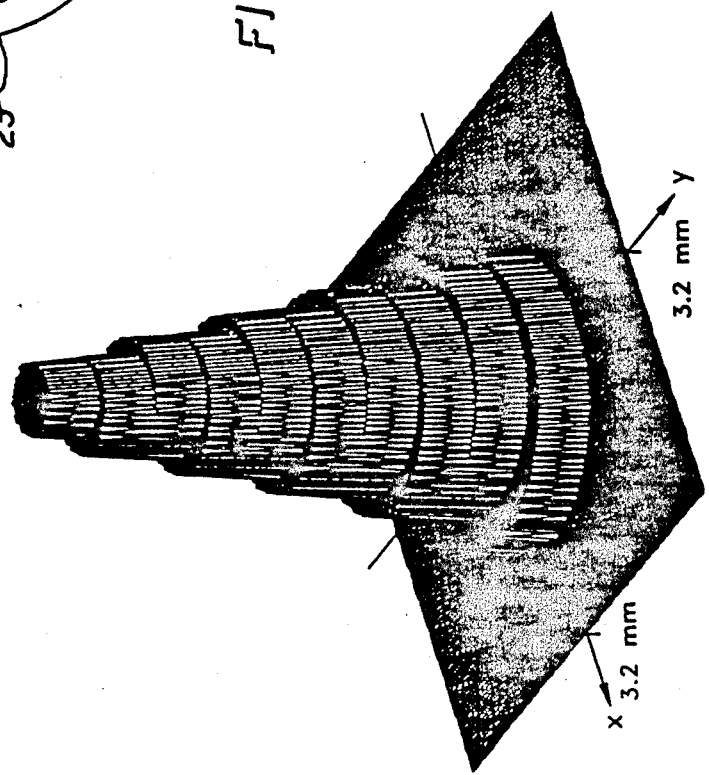
FIG. 14

MAGNETOMETER FLUX PICK-UP COIL WITH NON-UNIFORM INTERTURN SPACING OPTIMIZED FOR SPATIAL RESOLUTION

The United States Government has a paid-up license in this invention and the right in limited circumstances to require the patent owner to license others on reasonable terms as provided for by the terms of Grant No. AFOSR-87-0337 awarded by the United States Air Force Office of Scientific Research.

BACKGROUND OF THE INVENTION

1. Field of Invention

This invention relates to pickup coils used for generating current density images of the spatial distribution of two and three dimensional currents from the magnetic field produced by the currents. More specifically, the invention is directed to such coils having the spacing between multiple turns adjusted to provide a source-image transfer function with specific characteristics which improve the quality and spatial resolution of the image produced. The invention has particular application to the pickup coils used in the flux transformers of superconducting quantum interference devices (SQUIDs).

2. Background Information

It is known that an image of a two-dimensional current distribution can be reconstructed from measurements of its magnetic field using a magnetometer. This imaging technique can be useful in many applications such as noninvasive study of biological currents or nondestructive testing of electronic micro-circuits. There are several factors that determine the quality of the image: the magnitude and spatial extent of the current distribution, the noise of the magnetometer, the distance of the magnetometer to the current distribution, and the size of the magnetometer pickup coil. This patent is directed to the last of these factors, coil size, and presents a new optimized magnetometer coil design.

Traditionally magnetometer pickup coils are made of N turns of wire, each with the same radius, a. A number of different criteria have been used to optimize magnetometer pickup coil design. One of the most common is to determine the coil radius and number of turns that maximize the magnetometer signal-to-noise ratio for detecting an electric dipole in a conducting medium or a magnetic dipole in a non-magnetic medium. While this approach is useful, it does not take into account the spatial resolution achieved when imaging an extended source, an aspect of magnetometry that is growing in importance as investigators try to map localized current distributions with high spatial resolution.

A technique known as apodization is utilized in the field of optics to improve the spatial resolution of telescopes. A telescopic image of a distant object does not appear as a point but as a diffraction pattern, with the spatial extent of the pattern depending on the aperture of the telescope. A circular aperture will produce a diffraction pattern consisting of concentric rings. This ring system, which reduces the quality of the optical image, can be removed by apodization. The aperture function can be modified by placing a tinted glass over the aperture of the telescope with the opaqueness of the glass increasing from the center of the aperture to the edge. This modification eliminates the abrupt change in the aperture function at the edge of the aperture. The resulting diffraction pattern (which is just the square of the Fourier transform of the aperture function) is changed, and by a judicious choice of the aperture function, the ring system from the diffraction pattern can be greatly reduced or eliminated, thereby increasing the spatial resolution of the telescopic image.

A form of apodization has been applied to coils used in magnetic resonance imaging to make the coils easier to wind by reducing oscillations in the current density required to produce a magnetic field with a uniform gradient in a given space.

These coils are used for generating the magnetic field for the magnetic resonance imaging process and not to generate an image. Such coils are not at all suitable for generating current density images of two or three dimensional currents since they are specifically designed to provide a uniform magnetic field.

There is a need therefore for a magnetometer pickup coil for generating improved current density images of the spatial distribution of two and three dimensional currents from the magnetic fields produced by the currents.

More particularly, there is a need for such a magnetometer pickup coil with improved resolution.

There is also a need for such a magnetometer pickup coil with an improved signal-to-noise ratio.

There is a related need for providing such a pickup coil in which the size of the coil can be reduced while the number turns can be increased without a large increase in coil inductance.

There is in addition a particular need for such a low inductance coil for use in coupling to a thin film SQUID.

SUMMARY OF THE INVENTION

These and other needs are satisfied by the invention which is directed to flux pickup coils having a structure which is optimized through apodization for generating current density images of the spatial distribution of two and three dimensional currents from the magnetic field signal produced by the currents. Such pickup coils in accordance with the invention have a plurality of turns with each turn having a specifically chosen different radius. More particularly, they have a conductor disposed in a plurality of turns with the spacing between turns defined by a turns function having a filter function which has no zeroes within the spatial bandwidth of the magnetic field signal produced by the current.

Preferably, the coils are planar. Such coils can be readily implemented with thin-film fabrication techniques. The turns may be circular each with a constant radius and with parallel radial feed lines, or the coil can be wound in the form of a spiral with the pitch varying with radius to achieve the apodized configuration.

Various turns functions may be used to produce a coil in which the filter function which is the Fourier transform of the turns function has no zeroes within the selected spatial bandwidth of the magnetic field produced by the current to be imaged. One such turns function is the Gaussian function $e^{-\alpha^2 r^2}$ where r is the radius and $\alpha$ determines the overall size of the coil.

Another suitable turns function is $e^{-\alpha r/\alpha}$. A third appropriate transfer function is defined by $e^{-\alpha r/r}$. While this later function goes to infinity as the radius r goes to zero, a practical coil can be realized by truncating the function at some small value of r. The turns of coils in accordance with the invention can also take the configuration of regular polygons, preferably squares or hexagons, with the spacing between turns also defining a turns function having a filter function in which there are no zeroes within the spatial bandwidth of the magnetic field signal generated by the current to be imaged. The Gaussian and other turns functions discussed above can be applied to the polygonal coils as well.

BRIEF DESCRIPTION OF THE DRAWINGS

A full understanding of the invention can be gained from the following description of the preferred embodiments when read in conjunction with the accompanying drawings in which:

FIGS. 2A, 2B and 2C are plan views of magnetometer pickup coils in accordance with the prior art, while FIGS. 2D, 2E and 2F are similar views of exemplary magnetometer pickup coils in accordance with the invention.

FIGS. 5A through 5F are graphical representations as a function of radius of the turns functions of the coils of FIGS. 2A through 2F, respectively.

FIGS. 6A through 6F are graphical representations as a function of spatial frequency of the Fourier transforms of the turns functions of FIGS. 5A through 5F, and hence represent the filter functions for the coils of FIGS. 2A through 2F, respectively.

FIGS. 7A through 7F are line diagrams of the images of the current density of FIG. 7 generated through computer simulation for the coils of FIGS. 2A through 2F, respectively.

FIGS. 8A through 8F are isometric representations in the space domain of the x-component of the image of the current density of FIG. 7 generated through computer simulation for the coils of FIGS. 2A through 2F, respectively.

FIGS. 9A through 9F are isometric representations in the spatial frequency domain of the imaginary parts of the Fourier transforms of the current density for images from the coils 2A through 2F, respectively.

FIG. 10 is a plan view of a spiral wound pickup coil in accordance with the invention.

FIG. 11 is an isometric representation in the space domain of the turns function of the coil of FIG. 10.

FIG. 12 is an isometric representation in the spatial frequency domain of the Fourier transform of the turns function of FIG. 11, and hence represents the filter function of the coil of FIG. 10.

FIG. 13 is a plan view of a double spiral coil in accordance with the invention.

FIG. 14 is an isometric representation in the space domain of the turns function of the coil of FIG. 13.

FIG. 15 is an isometric representation in the spatial frequency domain of the Fourier transform of the turns function of FIG. 1.

DESCRIPTION OF THE PREFERRED EMBODIMENTS

Figure 1:
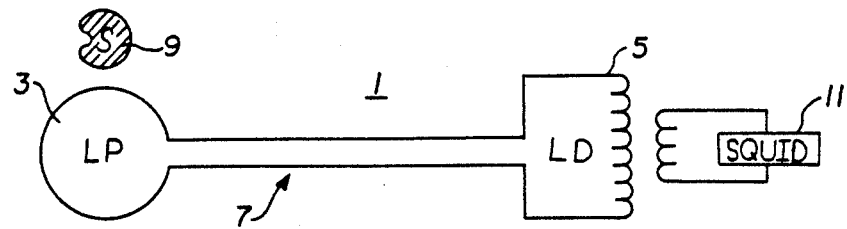
FIG. 1 is a schematic diagram of a SQUID magnetometer having a flux transformer with a pickup coil in accordance with the invention.

To fully appreciate apodization it is useful to first consider how magnetic fields are measured and how previous optimization techniques were used to design pickup coils. In many situations the magnetic field is weak enough that it must be measured with a Superconducting Quantum Interference Device (SQUID) magnetometer. Usually the SQUID does not detect the magnetic field directly, but indirectly by using a loop of superconducting wire called a flux transformer. Such an arrangement is shown schematically in FIG. 1. The flux transformer 1 includes a pickup coil 3 connected in series with an input coil 5 to form a superconducting loop 7. The pickup coil 3, with inductance $L_p$, detects a magnetic field produced by a source 9, and the input coil 5, with inductance $L_d$, is magnetically coupled to the SQUID 11. Either of these two coils 3 and 5 could have multiple turns. Since the magnetic flux through a superconducting loop 7 is constant, a magnetic flux, $\phi_p$, applied to the pickup coil 3 is transported to the SQUID 11 via the input coil 5. The current, I, in the flux transformer 1 is given by:

$$I = \frac{\phi_p}{L_p + L_d} \qquad \text{Eq. 1}$$

The flux at the SQUID, and therefore the amplitude of the measured signal, is proportional to I. Since $L_d$ is fixed for a given magnetometer, we can maximize the magnetometer signal by designing a pickup coil that couples a large flux and has a small inductance. For a pickup coil consisting of N tightly wound turns, each of radius a, the inductance is:

$$L_p = \mu_0 a N^2 \left[ \ln\left(\frac{8a}{c}\right) - 2.0 \right] \qquad \text{Eq. 2}$$

where $\mu_0$ is $4\pi \times 10^{-7}$ H/m and c is the radius of the wire (the constant 2.0 is used because the coil is made out of superconducting wire). If we assume that the magnetic field, B, is constant over the coil area, then the magnetic flux through the pickup coil 3 is given by:

$$\phi_p = BN\pi a^2 \qquad \text{Eq. 3}$$

We can substitute Eqs. 2 and 3 into Eq. 1 to get an expression for the flux transformer current I in terms of the coil parameters a and N. The maximization of I with respect to N leads to the commonly quoted result that the inductance of a pickup coil is optimized when the pickup and input coils are impedance matched, i.e., $L_p = L_d$. Additionally, maximization of I with respect to the radius a indicates that a coil which satisfies the impedance matching condition with a few large turns is better than a coil with the same inductance produced by many small turns.

The reciprocity theorem can be used to show that a magnetic dipole produces a magnetic flux of:

$$\phi_p = \frac{N \mu_o m_z}{2} \frac{a^2}{(z^2 + a^2)^{3/2}} \qquad \text{Eq. 4}$$

through a circular pickup coil with N turns each of radius a, where $m_z$ is the component of the dipole moment perpendicular to the coil area and z is the distance from the center of the coil to the dipole. If the flux transformer current I is calculated using Eq. 4 for $\phi_p$ instead of Eq. 3, a more accurate optimization scheme is developed that takes into account the variation of the magnetic field across the coil area. Maximization of I with respect to N again shows that the input and pickup coils should have the same inductance, or $L_p = L_d$ (this is true whenever $\phi_p$ is proportional to N and $L_p$ is proportional to $N^2$). Maximization of I with respect to the coil radius leads to an optimum radius of so $\sqrt{2}$ z, that the coil radius that optimizes the flux coupled to the SQUID depends on the distance from the coil to the source.

Equation 4 holds only for a dipole source. In many cases, we wish to obtain more information about a current distribution than just the strength and location of the dipole moment. Often it is desirable to be able to determine the size and shape of a current pattern from magnetic data, i.e., obtain an image of the current distribution. A coil designed for magnetic imaging must not only be optimized for maximum signal-to-noise ratio, but also for spatial resolution.

Figures 2A, 2B, 2C, 2D, 2E, 2F:
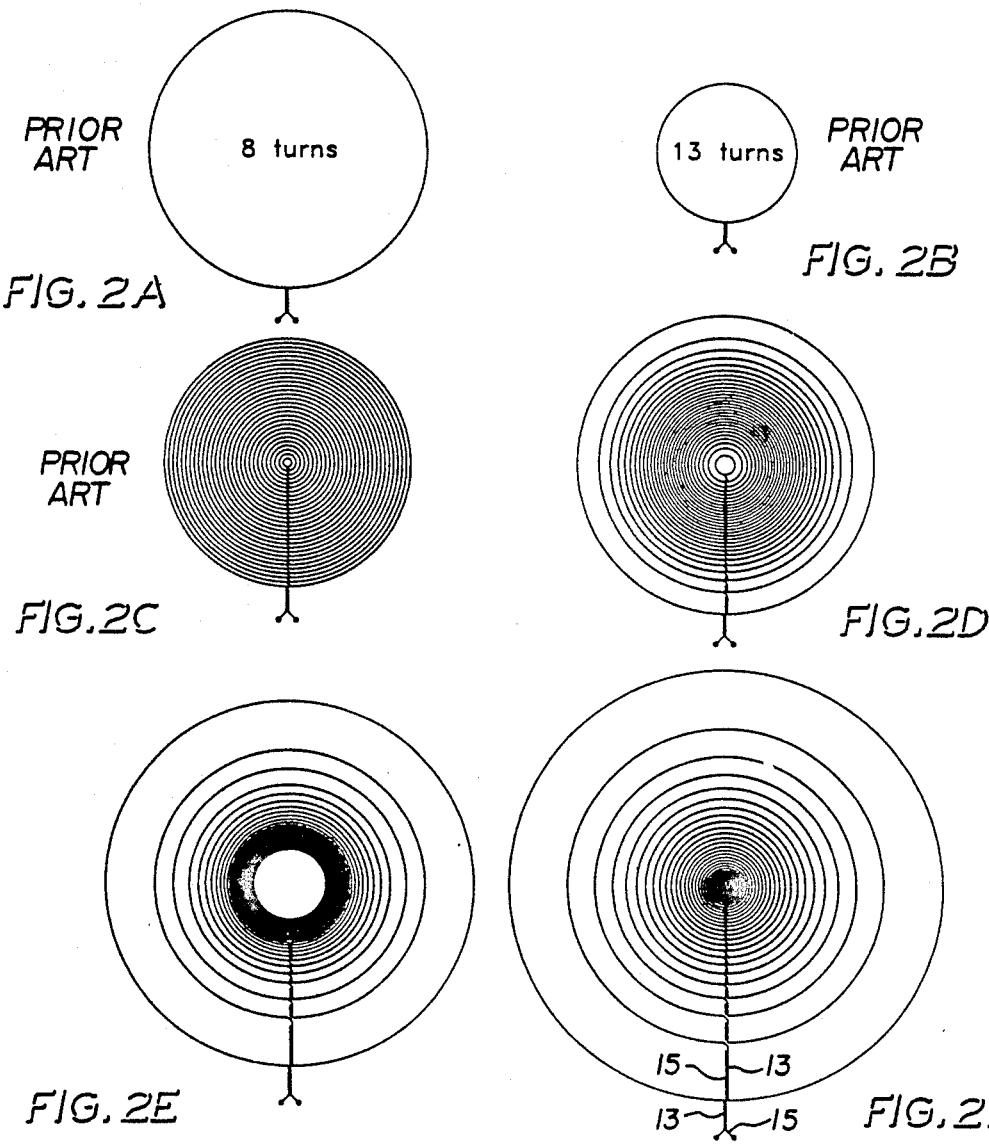
Figure 3A:
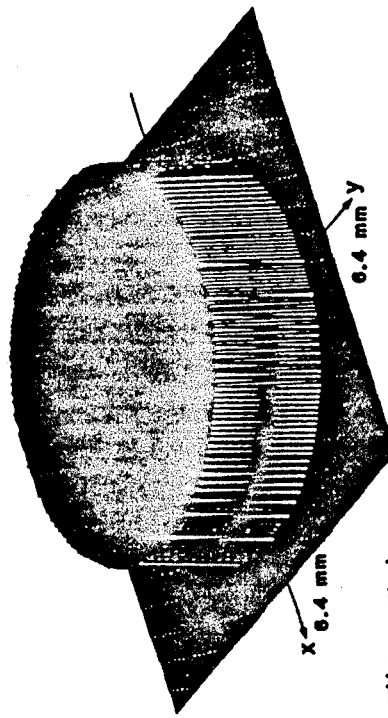
FIGS. 3A through 3F are isometric representations in the space domain of the turns functions of the coils of FIGS. 2A through 2F, respectively.
Figure 3B:
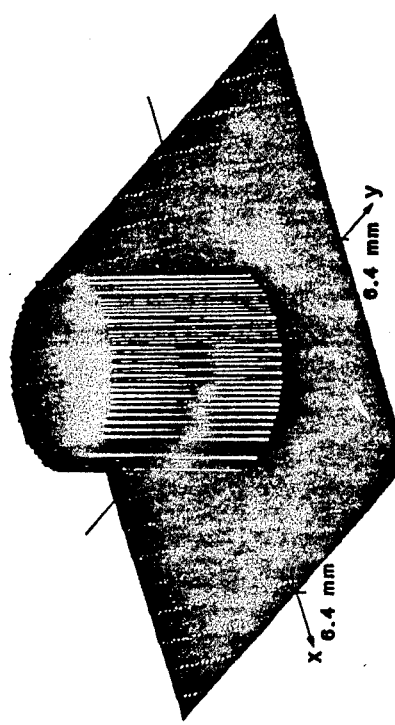

In general, spatial resolution is increased by making the radius of the coil smaller, so a current distribution that is localized in a small region of space can be resolved in more detail. We can discuss spatial resolution quantitatively using Fourier analysis. The magnetic flux through the pickup coil is a convolution of the coil area with the magnetic field. Consider a circular coil lying in the x-y plane. For any point in the plane we define the turns function, H(x,y), as being equal to the number of turns of the coil encircling the point x,y. If a coil is made up of N turns, each with the same radius a and centered at the origin as shown in FIG. 2A, then the turns function is:

$$H(r) = N \quad r < a \qquad \text{Eq. 5}$$
$$H(r) = 0 \quad r > a$$

where r is the radial coordinate in the x-y plane, and we ignore the diameter of the wire. A plot of this function is shown in FIG. 3A. Using the turns function, we can write the magnetic flux, $\phi_p(x,y)$, through the pickup coil centered at x,y as:

$$\phi_p(x,y) = \int_{-\infty}^{+\infty} \int_{-\infty}^{+\infty} H(x - x', y - y') B(x', y') \, dx' \, dy' \qquad \text{Eq. 6}$$

From the convolution theorem, we can rewrite the convolution of two functions as the product of their Fourier transforms:

$$\phi_p(k_x,k_y) = h(k_x,k_y) \, b(k_x,k_y) \qquad \text{Eq. 7}$$

where $\phi_p(k_x,k_y)$ and $b(k_x,k_y)$ are the Fourier transforms of $\phi_p(x,y)$ and B(x,y), and where $h(k_x,k_y)$, called the filter function, is the Fourier transform of the turns function H(x,y). The Fourier transform is defined as:

$$\phi(k_x, k_y) = \int_{-\infty}^{+\infty} \int_{-\infty}^{+\infty} \phi(x, y) \, e^{i(k_x x + k_y y)} \, dx \, dy \qquad \text{Eq. 8}$$

and the inverse transform as:

$$\phi(x, y) = \frac{1}{(2\pi)^2} \int_{-\infty}^{+\infty} \int_{-\infty}^{+\infty} \phi(k_x, k_y) \, e^{-i(k_x x + k_y y)} \, dk_x \, dk_y \qquad \text{Eq. 9}$$

The variables $k_x$ and $k_y$ are the two components of the spatial frequency k. Thus the convolution of the magnetic field with the turns function is equivalent to filtering the Fourier transform of the magnetic field with the filter function.

Figure 4A:
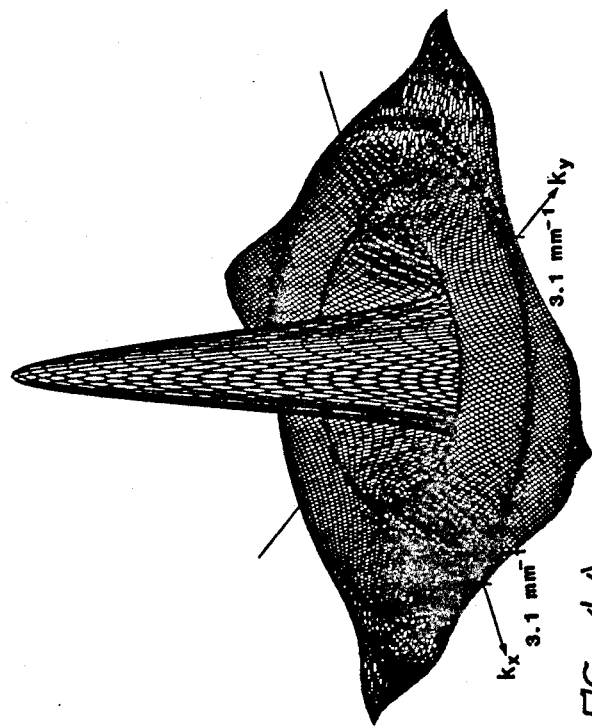
FIGS. 4A, through 4F are isometric representations in the spatial frequency domain of the Fourier transforms of the turns functions of FIGS. 3A through 3F, and hence represent the filter functions of the coils of FIGS. 2A through 2F, respectively.
Figure 4B:
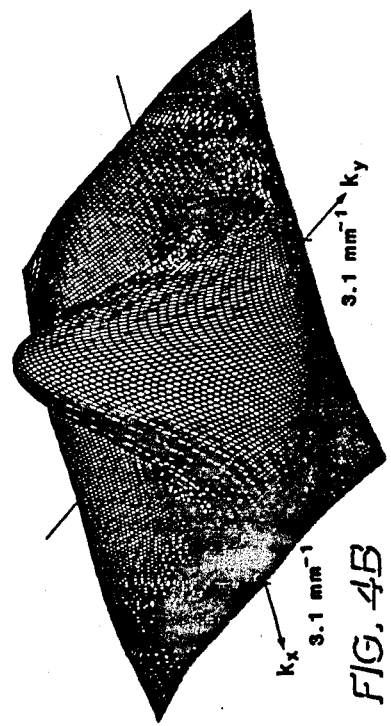

The filter function can be computed analytically from the turns function in Eq. 5 and is:

$$h(k) = \frac{2\pi N a}{k} J_1(ka) \qquad \text{Eq. 10}$$

where $J_1$ is the first order Bessel function of the first kind, and k is the magnitude of the spatial frequency vector, $|k|$. As shown in FIG. 4A, the filter function is a low-pass filter since at large k, h(k) becomes small. When the argument of the Bessel function is small, $J_1(ka)$ is approximately equal to ka/2, so h(0) is equal to $N\pi a^2$, the total area of the pickup coil. We are particularly interested in the zeroes of h(k). The $J_1$ Bessel function oscillates, and therefore has infinitely many zeroes; the first zero is located at $k_1 = 3.83/a$, and the second at $k_2 = 7.02/a$.

The properties of the filter function are closely related to the spatial resolution of the coil. It is often desirable to have the SQUID signal proportional to the magnetic field. This proportionality holds only if the magnetic field is essentially constant over the coil area, which is equivalent to requiring that frequencies contributing significantly to the Fourier transform of the magnetic field are much smaller than $k_1$, so that the filter function has a flat spatial frequency response. To ensure that this condition holds, the radius of the magnetometer coil must be much less than $3.83/k_{max}$, where $k_{max}$ is the largest spatial frequency contributing significantly to the magnetic field.

If the magnetometer coil is too large to ensure that the flux is proportional to the magnetic field, we may still be able to deconvolve the measured flux to obtain the magnetic field. In the spatial frequency domain, a deconvolution is equivalent to dividing the Fourier transform of the flux by the filter function, $h(k_x,k_y)$, to obtain the Fourier transform of the magnetic field. However, problems arise when $h(k_x,k_y)$ contains zeroes. If no noise is present in the magnetometer data, then the flux contains no frequency components at frequencies where h(k) is zero, so dividing $\phi(k_x,k_y)$ by h(k) results in an indeterminant quantity. If noise is present, then at the zeroes of h(k), the flux will have some contribution from the noise and dividing by zero is not allowed. Thus, we see that because of the presence of zeroes in the function h(k), we cannot uniquely obtain the magnetic field from the flux; some frequency components are not determined and must be considered as lost information. In fact, the problem exists even if h(k) is not zero but is very small, since if the signal is reduced until it is less than the noise, information is lost for all practical purposes. Note that if the first zero of h(k) is larger than the largest frequency contributing to the magnetic field, $k_{max}$, then no information is lost. We can simply set all spatial frequencies larger than $k_{max}$ to zero, and recover the magnetic field from the measured flux.

Consider the example of a pickup coil 3 with eight turns, each with a radius of 5 mm, as shown in FIG. 2A. An isometric plot of the turns function of this coil is shown in FIG. 3A while a similar plot of the filter function is shown in FIG. 4A. FIG. 5A is a graph of the turns function and FIG. 6A is a graph of the filter function for this coil. Similar plots and graphs for five other coils to be discussed are shown in views B through F of these figures. The isometric plots in FIGS. 3 and 4 are most useful for comparing the filter response to the spatial frequency content of the magnetic field and the current, while the graphs in FIGS. 5 and 6 are best suited for comparing turns functions and locating zeroes.

The coil shown in FIG. 2A, which we call coil A, has a total area ($N\pi a^2$) of 628 mm$^2$, an inductance of 1.88 $\mu$H (using Eq. 2 and assuming that the wire has a radius of 50 $\mu$m), and the first zero in the filter function, $k_1$, occurs at 0.766 mm$^{-1}$, as shown in FIG. 4A and FIG. 6A and in Table 1. This table sets forth for comparison the following parameters for the coil A and the five other coils to be discussed: the number of turns, N; the radius of the i$^{th}$ turn, $a_i$; the inductance of the coil, $L_p$; the spatial frequency of the first zero in the filter function, $k_1$; and the mean square deviation between the current density and its image, MSD.

the coil to 2.5 mm, thereby increasing $k_1$ to 1.53 mm$^{-1}$. We call this design, which is shown in FIG. 2B, coil B. To match inductances, we chose N equal to 13 ($L_p$=2.12 $\mu$H). The smaller radius of coil B implies that its area-turn product is less than that of coil A by a factor of 2.5, reducing the flux significantly. The difficulty in designing an optimum coil is evident. If we simply use smaller coils with more turns, our spatial resolution improves, but the sensitivity to the magnetic field decreases. In our optimization, we are constrained by both Eq. 2 for the inductance of the coil and also the functional form of the filter function h(k) given in Eq. 10. Equation 2 implies that the inductance increases as the square of the number of turns, so that a small increase in N leads to a large increase in inductance. The particular filter function given in Eq. 10 has many zeroes whose locations are scaled in inverse proportion to the coil radius. By winding coils using several turns, each with a different radius, we can modify our coil design so that neither Eq. 2 nor Eq. 10 applies. In particular, we can choose the radii of each turn so that the first zero of the filter function h(k) is at a relatively large value of spatial frequency. This process of optimizing the coil design is apodization.

Before we discuss designing an apodized pickup coil, however, consider a third coil, coil C, with 29 turns, having radii ranging from 0.153 to 4.434 mm, as given in Table 1 and as shown in FIG. 2C. These radii were selected so that the turns function of coil C, shown in FIG. 3C, has roughly the shape of a cone (the difference in radial distances between adjacent turns is constant), but has the same total area,

TABLE 1

|  | coil A | coil B | coil C | coil D | coil E | coil F |
|---|---|---|---|---|---|---|
| N | 8 | 13 | 29 | 29 | 29 | 29 |
| Area | 628 mm$^2$ | 255 mm$^2$ | 628 mm$^2$ | 628 mm$^2$ | 628 mm$^2$ | 628 mm$^2$ |
| $k_1$ | 0.766 mm$^{-1}$ | 1.53 mm$^{-1}$ | 1.31 mm$^{-1}$ | 2.02 mm$^{-1}$ | 2.25 mm$^{-1}$ | 3.04 mm$^{-1}$ |
| $L_p$ | 1.88 $\mu$H | 2.12 $\mu$H | 1.80 $\mu$H | 1.99 $\mu$H | 2.07 $\mu$H | 1.11 $\mu$H |
| $a_1$ | 5.0 mm | 2.5 mm | 0.153 mm | 0.349 mm | 1.284 mm | .033 mm |
| $a_2$ | 5.0 | 2.5 | 0.306 | 0.610 | 1.313 | .102 |
| $a_3$ | 5.0 | 2.5 | 0.459 | 0.795 | 1.344 | .173 |
| $a_4$ | 5.0 | 2.5 | 0.612 | 0.948 | 1.377 | .247 |
| $a_5$ | 5.0 | 2.5 | 0.764 | 1.085 | 1.411 | .324 |
| $a_6$ | 5.0 | 2.5 | 0.917 | 1.212 | 1.447 | .404 |
| $a_7$ | 5.0 | 2.5 | 1.070 | 1.331 | 1.487 | .487 |
| $a_8$ | 5.0 | 2.5 | 1.223 | 1.447 | 1.527 | .575 |
| $a_9$ |  | 2.5 | 1.376 | 1.556 | 1.570 | .666 |
| $a_{10}$ |  | 2.5 | 1.529 | 1.664 | 1.617 | .763 |
| $a_{11}$ |  | 2.5 | 1.682 | 1.772 | 1.667 | .864 |
| $a_{12}$ |  | 2.5 | 1.835 | 1.878 | 1.720 | .970 |
| $a_{13}$ |  | 2.5 | 1.988 | 1.983 | 1.778 | 1.083 |
| $a_{14}$ |  |  | 2.141 | 2.092 | 1.841 | 1.204 |
| $a_{15}$ |  |  | 2.293 | 2.200 | 1.909 | 1.331 |
| $a_{16}$ |  |  | 2.446 | 2.311 | 1.983 | 1.469 |
| $a_{17}$ |  |  | 2.599 | 2.424 | 2.065 | 1.617 |
| $a_{18}$ |  |  | 2.752 | 2.541 | 2.155 | 1.777 |
| $a_{19}$ |  |  | 2.905 | 2.662 | 2.256 | 1.952 |
| $a_{20}$ |  |  | 3.058 | 2.792 | 2.370 | 2.144 |
| $a_{21}$ |  |  | 3.211 | 2.926 | 2.501 | 2.358 |
| $a_{22}$ |  |  | 3.364 | 3.071 | 2.650 | 2.599 |
| $a_{23}$ |  |  | 3.517 | 3.230 | 2.825 | 2.873 |
| $a_{24}$ |  |  | 3.670 | 3.407 | 3.038 | 3.194 |
| $a_{25}$ |  |  | 3.822 | 3.605 | 3.302 | 3.580 |
| $a_{26}$ |  |  | 3.975 | 3.843 | 3.644 | 4.063 |
| $a_{27}$ |  |  | 4.128 | 4.136 | 4.121 | 4.709 |
| $a_{28}$ |  |  | 4.281 | 4.545 | 4.884 | 5.690 |
| $a_{29}$ |  |  | 4.434 | 5.324 | 6.651 | 7.802 |
| MSD | 0.531 | 1.634 | 0.575 | 0.458 | 0.453 | 0.453 |

Figure 4C:
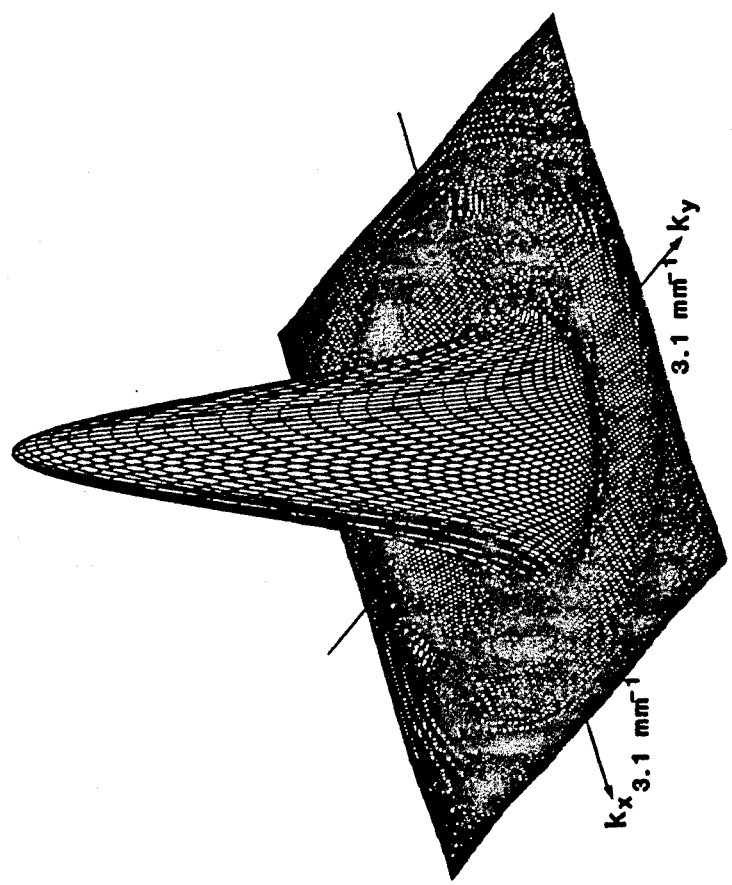
Figure 3C:
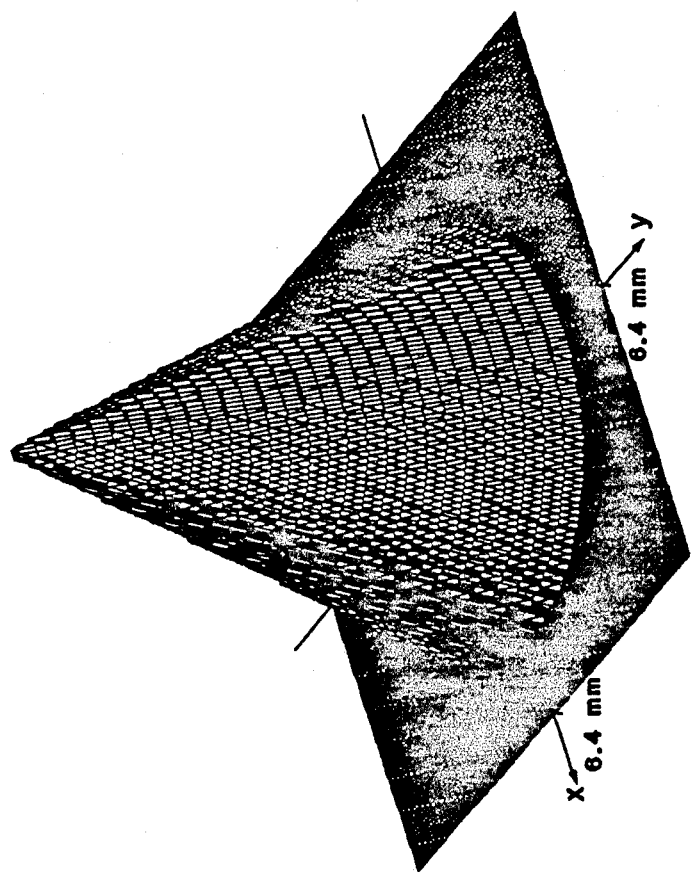

Let us assume that this coil A is designed optimally so that its inductance nearly matches the 2 $\mu$H inductance of the input coil 5. One way to improve the spatial resolution of the pickup coil is to decrease the radius of $$\sum_{i=1}^{N} \pi a_i^2,$$

as coil A. The corresponding filter function is shown in FIG. 4C. It has a different shape from the Bessel function in FIG. 4A, with less energy in the side lobes at $k > k_1$. FIG. 6C shows that the first zero of the filter function occurs at 1.31 mm$^{-1}$. Thus, we have improved on our original eight turn coil by improving spatial resolution ($k_1$ increased by a factor of 1.7) while keeping the area of the coil constant.

Besides improved spatial resolution, this coil C has another important advantage over equal radius coils: it has a smaller inductance. Since each turn has a different radius, the turns couple to each other more weakly than if they were the same size, thereby reducing the inductance of the entire coil. This is an advantage, because it allows us to reduce the coil inductance without decreasing the coil area. Note that since the coil inductance is no longer given by Eq. 2, it is no longer true that the coil design is optimized when the inductance of the input and pickup coils are equal; all other factors being equal, the lower the inductance of a coil the better. The inductance of coil C is 1.80 μH, lower than coil A even though coil C has greater than two and one-half times more turns than coil A. It is evident that coil C has a smaller inductance and a larger $k_1$ than coil A. The spatial resolution of coil C is nearly as good as coil B, but with a much better signal-to-noise ratio because of its larger turns-area product.

Figure 4D:
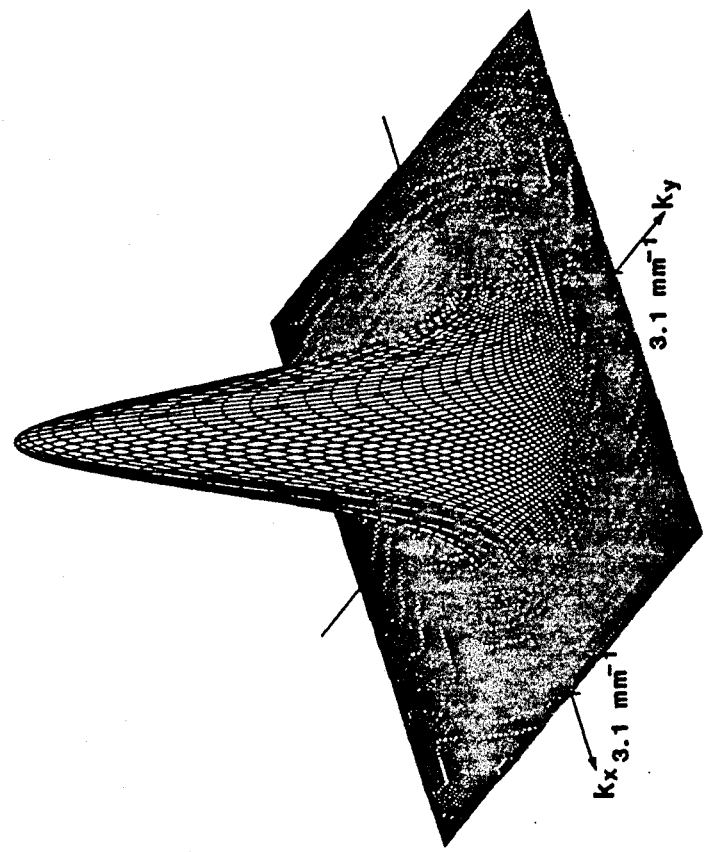
Figure 3D:
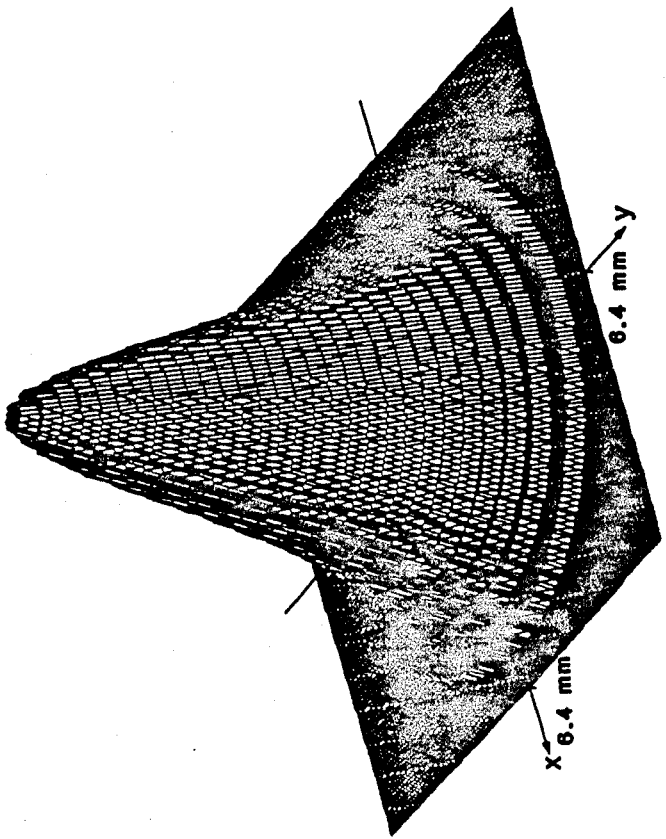

In accordance with the invention, we can, however, by applying apodizing techniques, design a coil that is even better than coil C. Our goal is to eliminate the zeroes in the filter function, or at least push the first zero to larger values of k. The Gaussian function, $e^{-k^2\lambda^2}$, (where k is the spatial frequency and λ is the length constant), has no zeroes, and is the Fourier transform of itself. Therefore, if we select our coil radii so that the turns function is a 29 turn coil with radii given in Table 1, selected so the turns function, shown in FIGS. 3D and 5D, approximates a Gaussian, we expect few, if any, zeroes in the filter function Coil D, which is shown in FIG. 2D, approximates a Gaussian and the coil has a total area of 628 mm$^2$. The filter function for this coil is shown in FIG. 4D, and the first zero occurs at $k_1 = 2.02$ mm$^{-1}$ (FIG. 6D), which is larger than for coil A by a factor of 2.6. The inductance of this coil is 1.99 μH. For most applications coil D is superior to coil C; it has a factor of 1.5 larger value of $k_1$ with only 10% larger inductance.

The Gaussian is not the only function upon which we can base our apodization technique. If the coil is made of concentric circular loops, then its turns function is radially symmetric (only a function of r, not the polar angle θ). In this case, we can simplify the two-dimensional Fourier transform relationship in Eq. 8 by converting to polar coordinates in the $k_x$, $k_y$ plane (k and θ), and integrating over θ analytically. We find that the turns function H(r) and the filter function h(k) are Fourier-Bessel transform pairs $$h(k) = 2\pi \int_0^\infty H(r) J_0(kr) r\, dr \qquad \text{Eq. 11}$$

A good choice for the turns function is one that has a Fourier-Bessel transform with few or no zeroes. One such function, as mentioned, is the Gaussian, $e^{-\alpha^2 r^2}$, which is its own Fourier-Bessel transform. Another choice is:

$$H(r) = C\frac{e^{-\alpha r}}{r} \quad h(k) = \frac{C}{2\pi}\frac{1}{\sqrt{k^2 + \alpha^2}}, \qquad \text{Eq. 12}$$

where C determines the total number of turns, α determines the overall size of the coil, and r is the radius. It is difficult to base apodization on this turns function because as r goes to zero the turns function goes to infinity. A large number of very small coils would be needed to approximate this function. A third possibility is:

$$H(r) = C\frac{r^{-\alpha r}}{\alpha} \quad h(k) = \frac{C}{2\pi}\frac{1}{(\sqrt{k^2 + \alpha^2})^3} \qquad \text{Eq. 13}$$

Figure 4E:
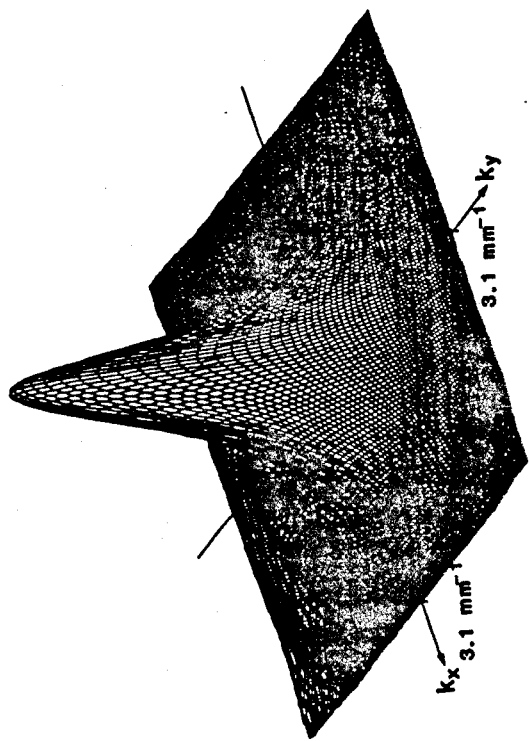
Figure 4F:
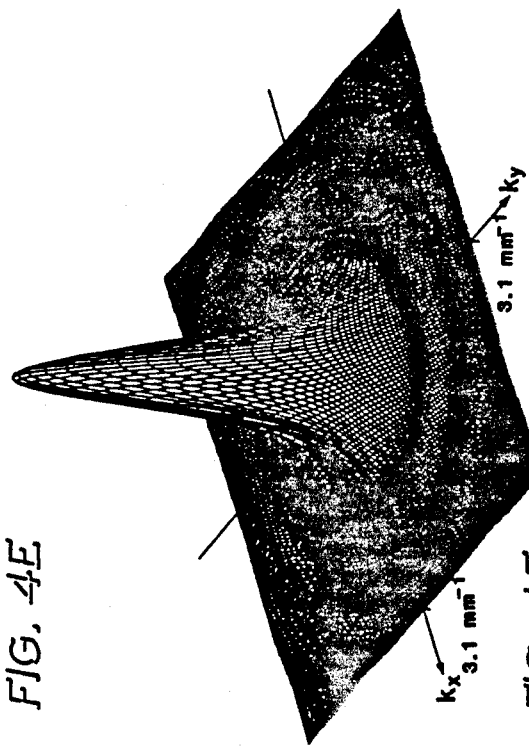
Figure 3E:
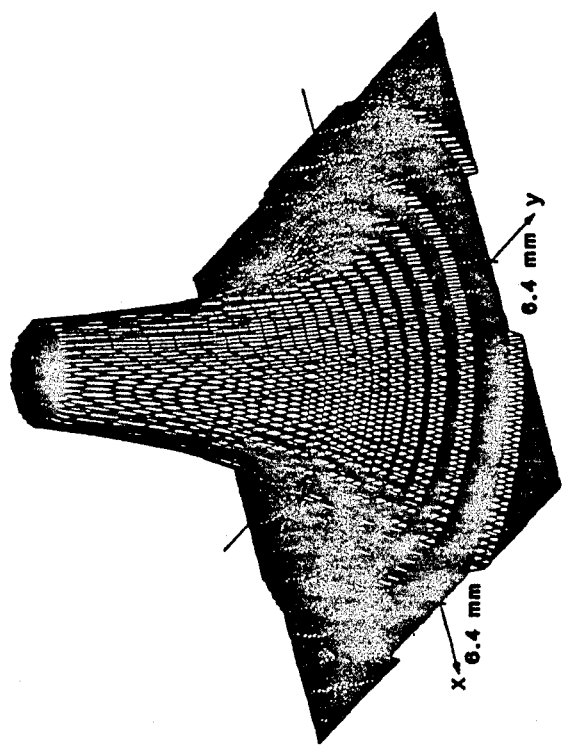
Figure 3F:
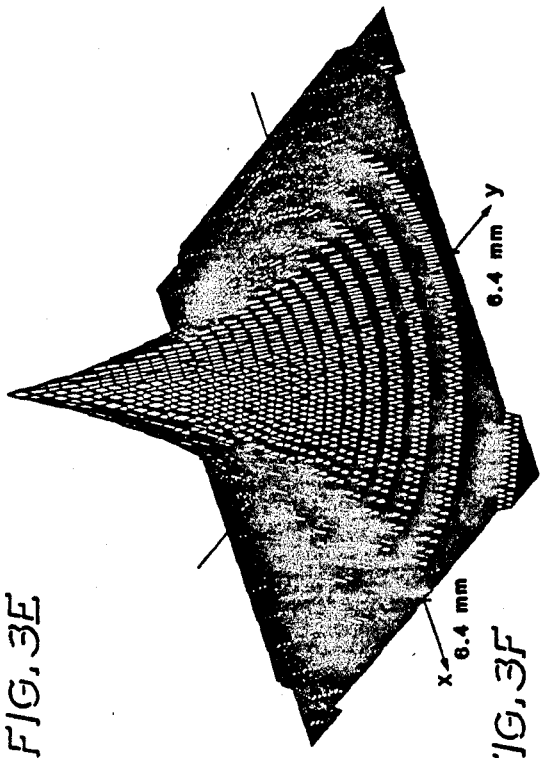

We have designed coils based on each of these latter turns functions, coil E shown in FIG. 2E using Eq. 12 and coil F shown in FIG. 2F using Eq. 13. In each case, the parameters C and α are chosen so that the coil consists of 29 turns and the turns-area product is equal to the turns-area product of coil A. For the coil E based on Eq. 12, we truncated the turns function, as shown in FIGS. 3E and 5E, at some small value of the radius, eliminating the large number of small loops. The filter function for coil E is shown in FIGS. 4E and 6E. We see that the apodized coil F based on an exponential turns function, shown in FIG. 3F and 5F, displays outstanding characteristics (Table 1), having a low inductance (1.11 μH) and a large value of $k_1$ (3.04 mm$^{-1}$) (see FIGS. 4F and 6F). Coils D and E generally do not perform as well as coil F, but are better than non-apodized coils.

Although the first zero of the filter function for coil D does not occur until $k = 2.02$ mm$^{-1}$, the amplitude of the filter function has fallen to only 10% of its peak value at $k = 1.2$ mm$^{-1}$ (FIG. 6D). It is not obvious how the small but non-zero values of h(k) for coils D, E and F influence the signal-to-noise ratio and spatial resolution. Certainly the relative ability of the six coils to image a current distribution depends on the amount of noise in the magnetometer and the distance between the magnetometer and the source.

Figure 7:
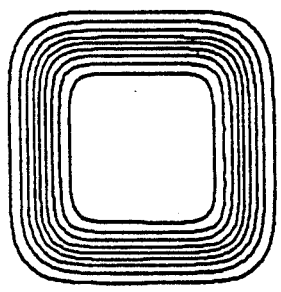
FIG. 7 is a line diagram of the current density of a sample source used to demonstrate the performance of the prior art coils and coils in accordance with the invention.
Figure 9:
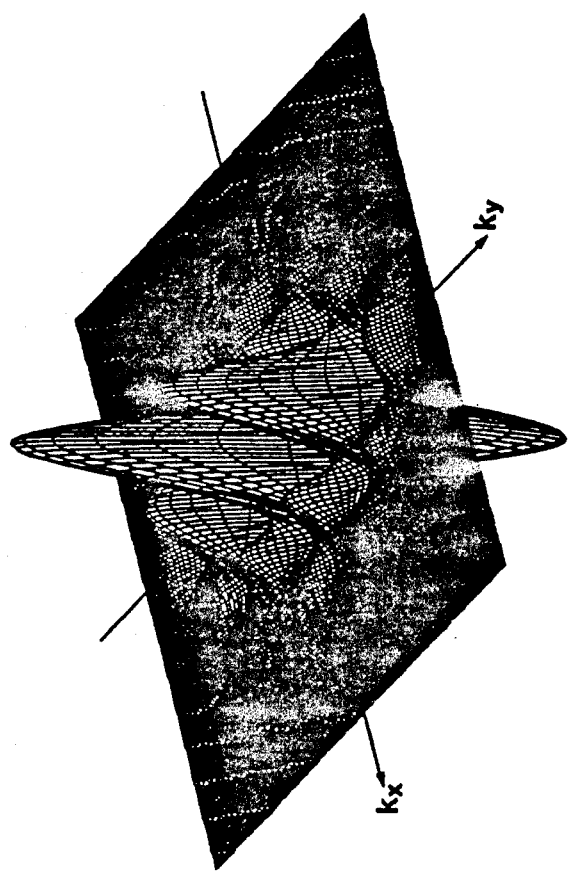
FIG. 9 is an isometric representation of the imaginary part of the Fourier transform of the x component shown in FIG. 8 of the current density illustrated in FIG. 7.
Figure 8:
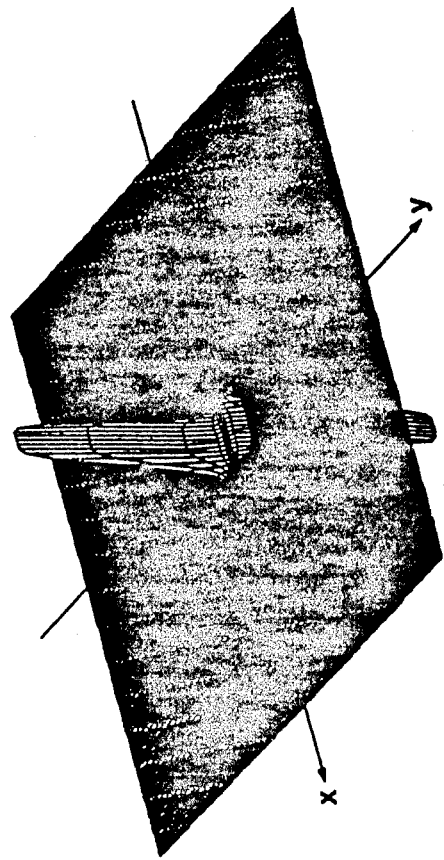
FIG. 8 is an isometric representation of the x-component of the current density of FIG. 7.
Figure 7D:
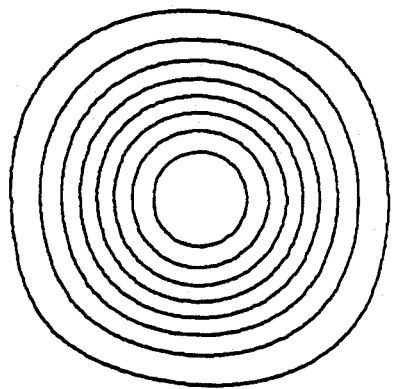
Figure 9D:
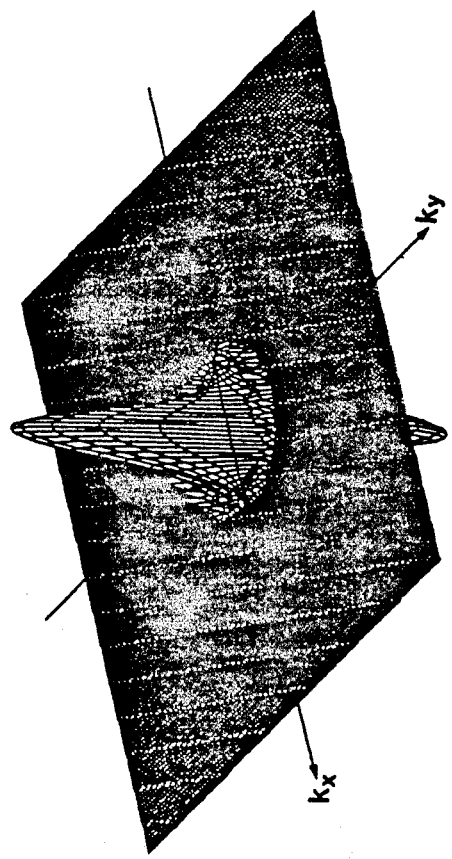
Figure 8D:
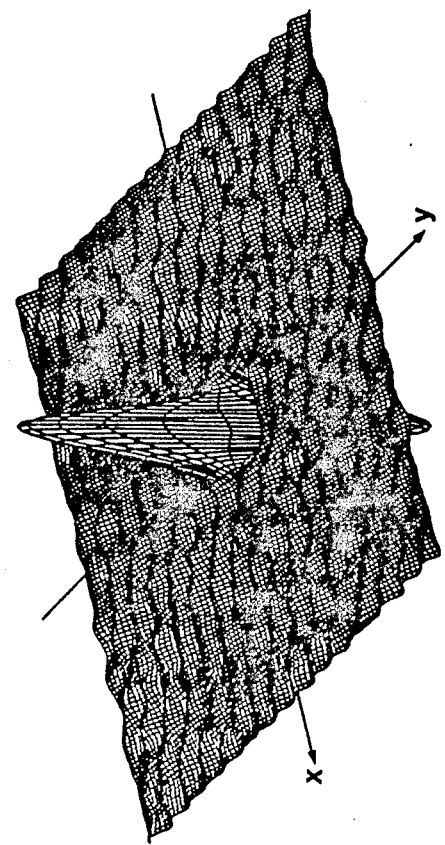
Figure 9E:
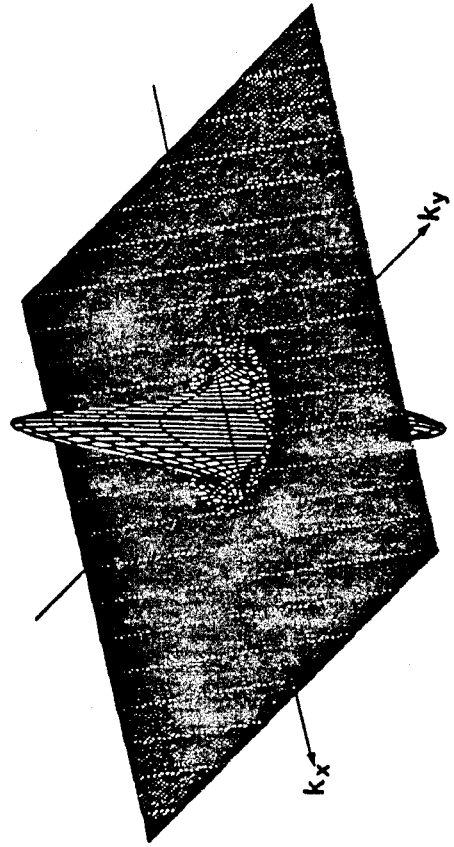
Figure 7E:
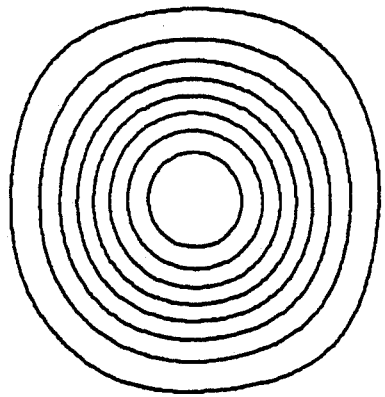
Figure 8E:
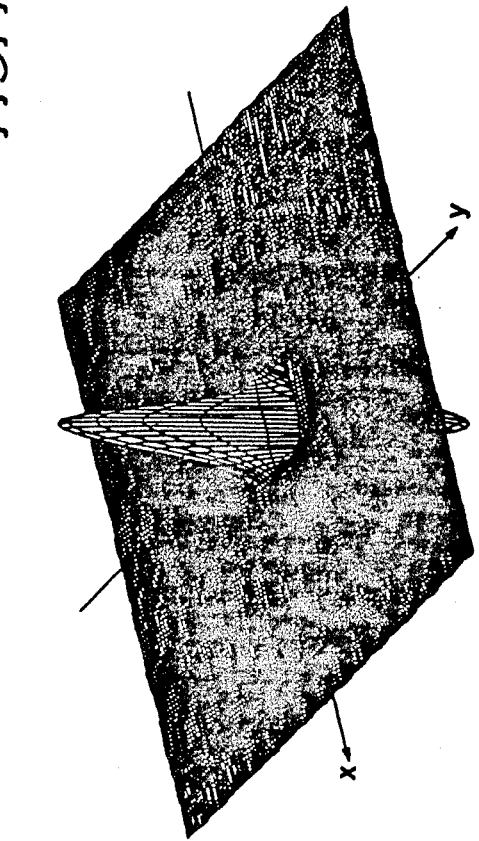
Figures 7F, 8F, 9F:
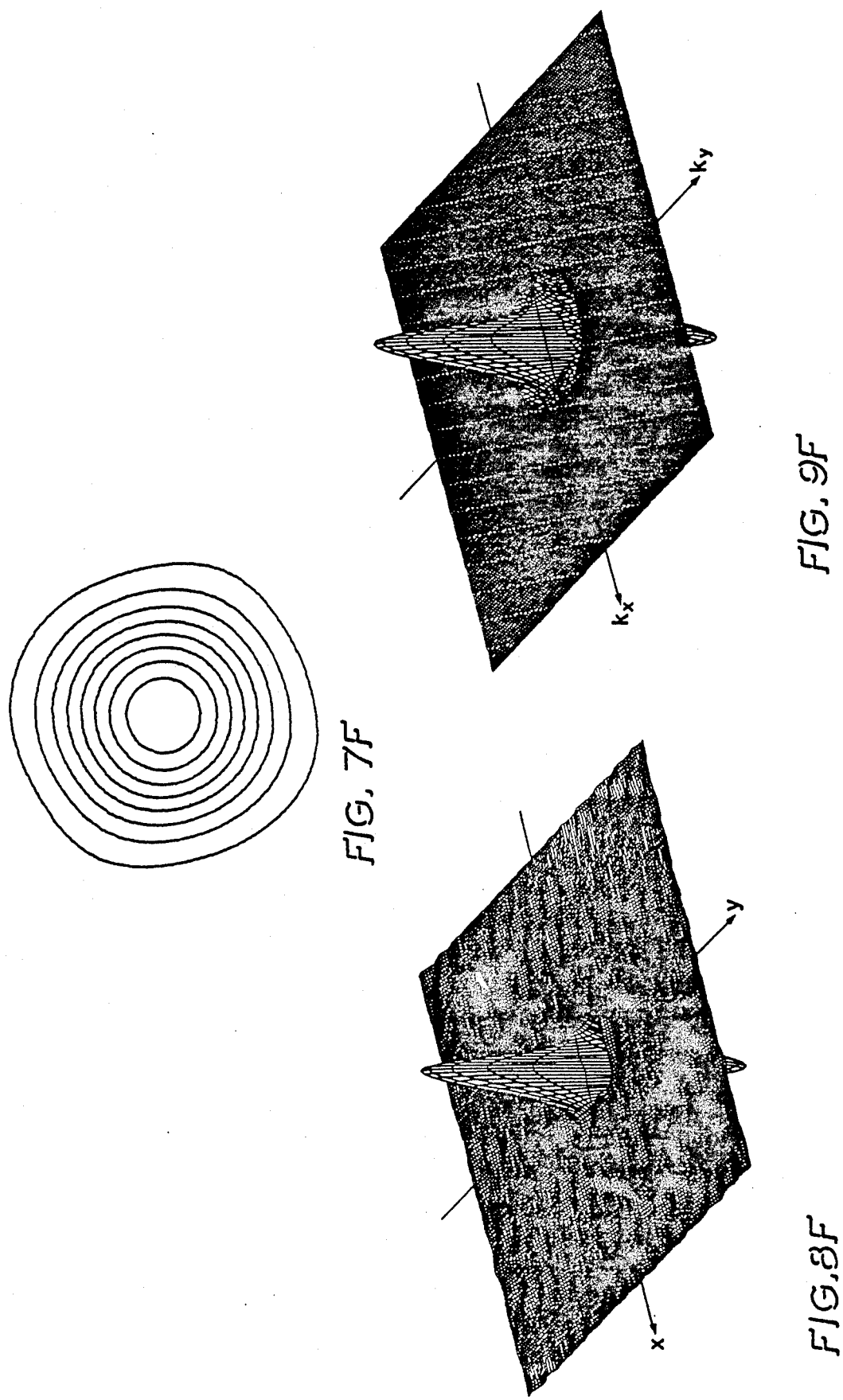

We have examined this point in more detail by simulating experiments to obtain an image of a current distribution for all six coils listed in Table 1 using the imaging techniques discussed in B. J. Roth, N. G. Sepulveda, and J. P. Wikswo, Jr., 1989, *Using a Magnetometer to Image a Two-dimensional Current Distribution, J. Appl. Physics,* 65(1): 361–372. We begin with a known current distribution; a square current loop with 5 mm long sides, where each side has a Gaussian distribution of current with length constant of 0.75 mm. This current distribution is shown in FIG. 7 where the current density is in the direction tangent to the lines, and the amplitude is proportional to the spacing between the lines. The x-component of the current density is shown in FIG. 8, and the imaginary part of its Fourier transform in FIG. 9. We then calculate the magnetic flux through the pickup coil produced by this current, taking into account both the distance, z, that the pickup coil is above the plane of the current (5 mm), and the design of the coil. Next we add noise to the magnetic flux and calculate an image of the current. We assume the noise is due to the intrinsic noise of the SQUID, and is the same at all spatial frequencies (spatially white). The amplitude of the SQUID noise, in terms of current through the flux transformer, is $1.5 \times 10^{-12}$ A/$\sqrt{\text{Hz}}$, and we assume a 100 Hz bandwidth, so the current noise is 15 pA. The current lines of the images of current density calculated from coils A through F are shown in FIGS. 7A through 7F, respectively. Similarly, the x-components of these current density images are illustrated in FIGS. 8A through 8F, respectively, and the imaginary parts of the Fourier transforms of the current densities for the images from these coils are shown in FIGS. 9A through 9F, respectively.

The high spatial frequency components of the current density are suppressed in the frequency spectrum of the magnetic flux. Thus, in the magnetic data, the noise dominates the signal at large k. When we calculate the current image form of these data, the high frequency components of the data are amplified, and the contribution of the noise to the image is greatly exaggerated. Therefore, we must low-pass filter the current image, eliminating the high frequency noise. In our calculation, we filtered our image by multiplying the noisy current image in the frequency domain by a Hanning window, with the largest spatial frequency passed, $k_{max}$, equal to 1.8 mm$^{-1}$. This improves the signal-to-noise ratio of the image, but limits its spatial resolution. Our results depend on the value of $k_{max}$ we choose: a larger value of $k_{max}$ increases our spatial resolution but also increases our noise. We use the same value of $k_{max}$ for all six coils and compare the signal-to-noise ratios of the images. Alternatively, we could have varied $k_{max}$ for each image until a particular signal-to-noise ratio was obtained and then compared the spatial resolution of each image.

To compare quantitatively the signal-to-noise ratio of the six images shown in FIGS. 7A through 7F to the original current illustrated in FIG. 7, we calculated the mean square deviation (MSD) between the original current vector, $J(,y)$, and its image, $J_{image}(x,y)$:

$$MSD = \frac{\int_{-\infty}^{+\infty}\int_{-\infty}^{+\infty} |J(x,y) - J_{image}(x,y)|^2 \, dx \, dy}{\int_{-\infty}^{+\infty}\int_{-\infty}^{+\infty} |J(x,y)|^2 \, dx \, dy} \quad \text{Eq. 14}$$

The lower the value of the MSD, the higher the signal-to-noise ratio and the better the image. The calculated values of the MSD, listed in Table 1, show that coils D through F, designed using apodization, have the best signal-to-noise ratios, and coil B, with the small turns-area product, has the worst. Insight into this behavior can be gained by studying the Fourier transforms of these images, shown in FIGS. 9A through 9F. In coils A, B and C, the spatial frequency spectrum of the image contains sharp spikes at discrete frequencies. These spikes, corresponding to the zeroes in the magnetometer coil filter function, would have infinite amplitude except for the fact that we perform our numerical calculations for discrete values of spatial frequency instead of a continuous spectrum. Thus, the amplitude of the spike depends in part on our grid spacing. We use 128 points in both the x and y directions with the spacing between adjacent points of 0.5 mm, leading to a spacing between points in the frequency domain of 0.098 mm$^{-1}$. If a circle in the $k_x$-$k_y$ plane is drawn with radius of $k_1$, then the discrete grid points falling nearest to this circle produce the spikes in the frequency spectrum of the image, implying a very poor signal-to-noise ratio at those particular frequencies. Spikes do not occur for the apodized coils, D, E and F, because the first zero in their filter functions occur at frequencies outside the maximum of the Hanning window. The average amplitude of the noise near the edge of the window is perhaps greater in apodized coils than in the non-apodized coils due to the small value of the filter function at these frequencies. However, no spikes occur in the frequency spectrum, and apparently it is these spikes that primarily contribute to the noise in the current image.

The amount of improvement in image quality from using apodized coils depends on the other parameters of the problem: the distance from the plane of the current source to the pickup coil, the spatial frequency spectrum of the current distribution, and the amount of magnetometer noise. For instance, as the distance from the pickup coil to the plane of the current distribution becomes larger, the signal-to-noise ratio at high spatial frequencies in the current image decreases, requiring a smaller value of $k_{max}$ for the Hanning window. If $k_{max}$ becomes smaller than the first zero in the filter function, $k_1$, then increasing $k_1$ even more through apodization provides relatively little improvement in image quality, and the coil with the largest total area and the lowest inductance produces the highest quality image. However, when $k_{max}$ is not limited by any other factor, apodization can improve images, as shown in the previous example.

An important feature of the apodized coil design is that it is more suitable for thin-film fabrication of planar coils than are multi-turn, single radius designs. The apodized coils D through F shown in FIGS. 2D through 2F have circular turns of constant radius with radial leads 13 (see FIG. 2F) connecting adjacent turns and a return lead 15 extending radially outward from the innermost turn. This return lead 15 can be provided on the opposite side of the substrate on which the coil is formed or separated from the turns by another insulating layer. The leads 13 and 15 are parallel and since they carry equal but opposite currents their effect on the response of such coils is negligible.

Rather than using circular coils, it may be easier to produce a planar, spiral winding, for which the pitch varies with radius, to achieve the apodized design. FIG. 10 shows such an apodized spiral coil 17 with five turns based on a Gaussian turns function. FIGS. 11 and 12 show the turns and filter functions, respectively, based on this design. Perhaps a more practical implementation is the double spiral coil 21 shown in FIG. 13. The coil 21 spirals inward from one end and then spirals outward in the same direction, to produce two spiral sections, 23 shown in full line and 25 in dashed line. The two sections are separated by an insulating layer, or they could be formed on opposite faces of a substrate.

Figure 16:
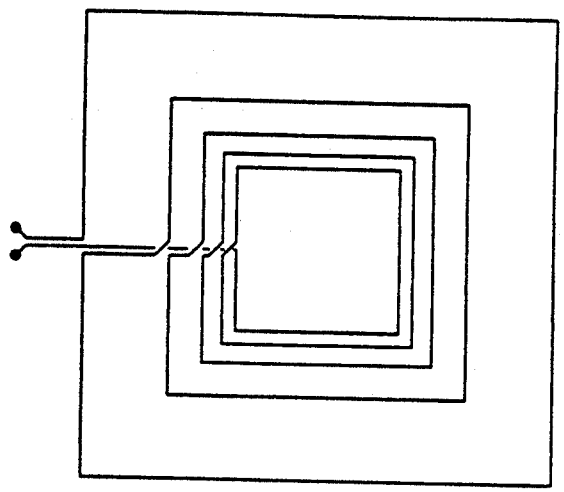
FIG. 16, 17 and 18 are plan views of square, hexagonal and octagonal coils, respectively, in accordance with the invention.
Figure 17:
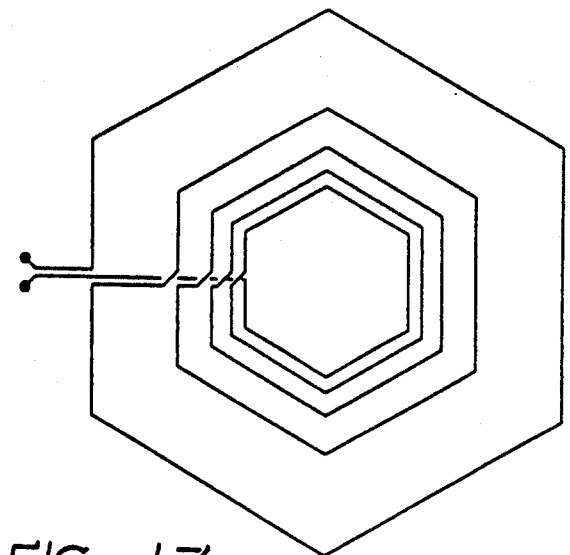
Figure 18:
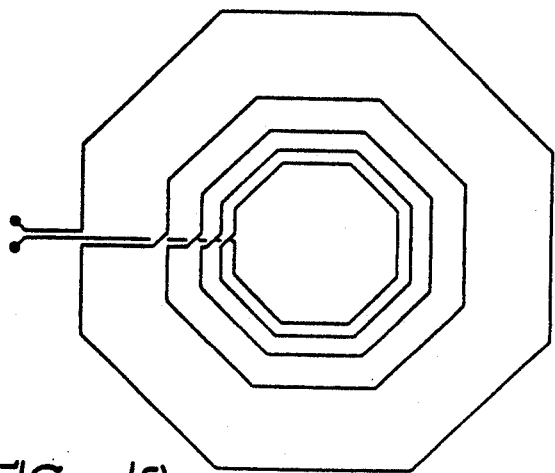

Other apodized coil shapes are also possible. For example only, the turns of varying radii could be in the form of regular polygons, and in particular squares such as shown in FIG. 16, hexagons as shown in FIG. 17 or octagons as shown in FIG. 18. The functions defining the spacing between turns in these polygonal coils may include those discussed above with regard to coils with circular turns where r would be the distance of the midpoint of a side of the polygon to the center. Irregular shapes are also possible, although it may be difficult to push the zeroes outside the bandwidth of the magnetic signal, as even regular polygons have many zeroes to be eliminated.

When the spatial-filtering technique of apodization is applied to the problem of optimizing magnetometer pickup coils, we find that planar pickup coils in which each turn has a different radius provide a higher-quality image of the current sources than do corresponding coils whose turns all have the same radius. The process of apodization involves designing a magnetometer coil whose transfer function has its first zero at a relatively large spatial frequency. Using apodization, we can decrease coil size and increase the number of turns without a large increase in coil inductance. Our results show that current images are improved by using apodized coils.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A flux pickup coil for measuring or mapping a magnetic field, said coil comprising a conductor disposed in a plurality of turns having a given total area and with non-uniform radial spacing between turns defined by a turns function having a filter function which has a first zero at a spatial frequency which is greater than a coil having a plurality of turns all of equal radius and said given total area.

2. The coil of claim 1 wherein the spacing between turns is defined by a Gaussian turns function.

3. The coil of claim 2 wherein all of said turns are in a common plane.

4. The coil of claim 1 wherein the spacing between turns is defined by a turns function having the following relationship:

$$h(r) = C \frac{e^{-\alpha r}}{r}$$

where h(r) is the turns function, C determines the total number of turns, $\alpha$ determines the overall size of the coil, and r is the radius.

5. The coil of claim 4 wherein all of said turns are substantially in a common plane.

6. The coil of claim 1 wherein the spacing between turns is defined by a turns function having the following relationship:

$$h(r) = C \frac{e^{-\alpha r}}{\alpha}$$

where h(r) is the turns function, C determines the total number of turns, $\alpha$ determines the overall size of the coil, and r is the radius.

7. The coil of claim 6 wherein all of said turns are substantially in a common plane.

8. The coil of claim 1 wherein all of said turns are substantially in a common plane 9. The coil of claim 8 wherein each of said turns is a circular turn of constant radius.

10. The coil of claim 9 wherein said circular turns are serially interconnected by aligned radially extending interconnecting conductor sections, and wherein an additional conductor section extends radially outward from the innermost turn adjacent said interconnecting conductor sections.

11. The coil of claim 10 wherein spacing between turns is defined by a Gaussian turns function.

12. The coil of claim 10 wherein the spacing between turns is defined by a turns function having the following relationship:

$$h(r) = C \frac{e^{-\alpha r}}{r}$$

where h(r) is the turns function, C determines the number or turns in the coil, $\alpha$ is a factor determining the overall size of the coil, and r is the radius.

13. The coil of claim 10 wherein the spacing between turns is defined by a turns function having the following relationship:

$$h(r) = C \frac{e^{-\alpha r}}{\alpha}$$

where h(r) is the turns function, C determines the number of turns in the coil, $\alpha$ is a factor determining the overall size of the coil, and r is the radius.

14. The coil of claim 8 wherein said turns are formed by a spiral winding of said conductor.

15. The coil of claim 14 wherein the spacing between turns is defined by Gaussian turns function.

16. The coil of claim 14 wherein the spacing between turns is defined by a turns function having the following relationship:

$$h(r) = C \frac{e^{-\alpha r}}{r}$$

where h(r) is the turns function, C determines the number of turns in the coil, $\alpha$ is a factor determining the overall size of the coil, and r is the radius.

17. The coil of claim 14 wherein the spacing between turns is defined by a turns function having the following relationship:

$$h(r) = C \frac{e^{-\alpha r}}{\alpha}$$

where h(r) is the turns function, C determines the number of turns in the coil, $\alpha$ is a factor determining the overall size of the coil, and r is the radius.

18. The coil of claim 8 wherein said conductor is wound in a first spiral which winds inward in one direction in one plane and winds outward in a concentric second spiral in the same direction in an adjacent parallel plane.

19. The coil of claim 18 wherein the spacing between turns in said first and second spirals is defined by a Gaussian turns function.

20. The coil of claim 18 wherein the spacing between turns in said first and second spirals is defined by a turns function having the following relationship:

$$h(r) = C \frac{e^{-\alpha r}}{r}$$

where h(r) is the turns function, C determines the number of turns in the coil, α is a factor determining the overall size of the coil, and r is the radius.

21. The coil of claim 15 wherein the spacing between turns in said first and second spirals defined by a turns function having the following relationship:

$$h(r) = C \frac{e^{-\alpha r}}{\alpha}$$

where h(r) is the turns function, C determines the number of turns in the coil, α is a factor determining the overall isze of the coil, and r is the radius.

22. The coil of claim 8 wherein said conductor is wound with polygonal turns.

23. The coil of claim 22 wherein the spacing between said polygonal turns is defined by a Gaussian turns function.

24. The coil of claim 22 wherein the spacing between turns is defined by a turns function having the following relationship:

$$h(r) = C \frac{e^{-\alpha r}}{r}$$

where h(r) is the turns function, C determines the number of turns in the coil, α is a factor determining the overall size of the coil, and r is the radius of the midpoint of a side of each turn of the coil.

25. The coil of claim 22 wherein the spacing between said polygonal turns is defined by a turns function having the following relationship:

$$h(r) = C \frac{e^{-\alpha r}}{\alpha}$$

where h(r) is the turns function, C determines the number of turns in the coil, is a factor determining the overall size of the coil, and r is the radius of the midpoint of a side of each turn of the coil.

26. The coil of claim 22 wherein each of said turns is a regular polygon and said turns are serially interconnected by aligned radially extending interconnecting conductor sections and wherein an additional conductor section extends radially outward from the innermost turn adjacent said interconnecting sections.

* * * * *

UNITED STATES PATENT AND TRADEMARK OFFICE
CERTIFICATE OF CORRECTION

PATENT NO.   : 5,038,104
DATED        : August 6, 1991
INVENTOR(S)  : JOHN P. WIKSWO, JR. and BRADLEY J. ROTH It is certified that error appears in the above-identified patent and that said Letters Patent is hereby corrected as shown below: On the Title page, item [54] and Col. 1:

In the title, line 1, insert --A-- before the word "MAGNETOMETER".

Column 4, line 5, "1" should be --14--.

Column 5, line 20, before the word "that" insert --so--.

Column 9, line 43, after the word "function" insert --.--.

Column 14, line 16, delete "or" and insert --of--.

Signed and Sealed this

Twentieth Day of July, 1993

Attest:

MICHAEL K. KIRK

*Attesting Officer*   *Acting Commissioner of Patents and Trademarks*